US009515284B2

(12) United States Patent
Nakamura et al.

(10) Patent No.: US 9,515,284 B2
(45) Date of Patent: Dec. 6, 2016

(54) ORGANIC ELECTROLUMINESCENCE ELEMENT AND PRODUCTION METHOD THEREFOR

(75) Inventors: Masahiro Nakamura, Eindhoven (NL); Masahito Yamana, Hyogo (JP); Mitsuo Yaguchi, Osaka (JP); Takeyuki Yamaki, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/116,249

(22) PCT Filed: Jul. 26, 2012

(86) PCT No.: PCT/JP2012/069033
§ 371 (c)(1),
(2), (4) Date: Nov. 7, 2013

(87) PCT Pub. No.: WO2013/015384
PCT Pub. Date: Jan. 31, 2013

(65) Prior Publication Data
US 2014/0097427 A1 Apr. 10, 2014

(30) Foreign Application Priority Data
Jul. 27, 2011 (JP) .................................. 2011-164188

(51) Int. Cl.
*H01L 51/52* (2006.01)
*H01L 51/56* (2006.01)
*H01L 27/32* (2006.01)

(52) U.S. Cl.
CPC ....... *H01L 51/5203* (2013.01); *H01L 27/3288* (2013.01); *H01L 51/5209* (2013.01);
(Continued)

(58) Field of Classification Search
CPC .. H01L 51/5203; H01L 51/5209; H01L 51/56; H01L 51/5259; H01L 27/3288; H01L 2251/5315; H01L 2251/5353; H01L 2251/5361
(Continued)

(56) References Cited

U.S. PATENT DOCUMENTS 6,657,236 B1* 12/2003 Thibeault ................ H01L 33/20
257/81
7,135,815 B2 11/2006 Tsuchiya
(Continued)

FOREIGN PATENT DOCUMENTS

| JP | H11-219782 | 8/1999 |
|---|---|---|
| JP | H11-312581 | 11/1999 |

(Continued)

OTHER PUBLICATIONS

International Search Report and Written Opinion for corresponding International Application No. PCT/JP2012/069033 mailed Nov. 6, 2012.
(Continued)

*Primary Examiner* — John C Ingham
*Assistant Examiner* — Didarul Mazumder
(74) *Attorney, Agent, or Firm* — Renner, Otto, Boisselle & Sklar, LLP

(57) ABSTRACT

The organic electroluminescence element of the present invention includes: a first substrate; a second substrate facing the first substrate; an element member between the first and second substrates; first and second extension electrodes on first and second inner surfaces of the first and second substrates facing the element member; and an insulating member having an electrically insulating property. The element member includes: a functional layer including a light-emitting layer and having first and second surfaces in
(Continued)

a thickness direction; and first and second electrode layers on the respective first and second surfaces of the functional layer. The element member is between the first and second extension electrodes such that parts of the first and second electrode layers are in contact with the first and second extension electrodes respectively. The insulating member is between the first and second inner surfaces of the respective first and second substrates.

18 Claims, 9 Drawing Sheets

(52) U.S. Cl.
CPC .......... *H01L 51/5259* (2013.01); *H01L 51/56* (2013.01); *H01L 2251/5315* (2013.01); *H01L 2251/5353* (2013.01); *H01L 2251/5361* (2013.01)

(58) Field of Classification Search
USPC ........................................ 257/40; 438/82, 99
See application file for complete search history.

(56) References Cited

U.S. PATENT DOCUMENTS

| | | | | |
|---|---|---|---|---|
| 7,189,591 | B2* | 3/2007 | Suehiro | B29C 43/021 257/E21.002 |
| 7,521,727 | B2* | 4/2009 | Khanarian | H01L 33/22 257/100 |
| 7,955,531 | B1* | 6/2011 | Khanarian | G02B 6/0036 156/60 |
| 8,114,691 | B2* | 2/2012 | Lee | H01L 33/12 257/E33.001 |
| 2003/0209707 | A1* | 11/2003 | Tsuchiya | G02F 1/133603 257/40 |
| 2004/0238815 | A1* | 12/2004 | Park | H01L 51/5237 257/40 |
| 2005/0263775 | A1* | 12/2005 | Ikeda et al. | 257/79 |
| 2008/0185960 | A1 | 8/2008 | Koshiyama | |
| 2009/0014748 | A1* | 1/2009 | Hirao | H01L 21/6835 257/99 |
| 2010/0140635 | A1* | 6/2010 | Ibbetson | H01L 33/10 257/98 |
| 2011/0006387 | A1* | 1/2011 | Katsuno | H01L 27/14625 257/433 |
| 2011/0012139 | A1* | 1/2011 | Yamamoto | H01L 51/5275 257/88 |
| 2011/0121352 | A1 | 5/2011 | Hesse et al. | |
| 2011/0143468 | A1* | 6/2011 | Chen | G02F 1/133305 438/30 |
| 2011/0169044 | A1* | 7/2011 | Chen | H01L 33/02 257/99 |
| 2012/0112212 | A1* | 5/2012 | Kim | H01L 51/5246 257/88 |

FOREIGN PATENT DOCUMENTS

| | | |
|---|---|---|
| JP | 2000-515309 | 11/2000 |
| JP | 2002-043054 * | 2/2002 |
| JP | 2003-272849 | 9/2003 |
| JP | 2005-078906 | 3/2005 |
| JP | 2007-220569 | 8/2007 |
| JP | 2008-047298 | 2/2008 |
| JP | 2010-80307 A | 4/2010 |
| JP | 2011-108651 | 6/2011 |
| WO | WO 98/53644 | 11/1998 |
| WO | WO 2009/025186 | 2/2009 |

OTHER PUBLICATIONS

English translation of Office Action for corresponding Chinese Application No. 201280024253.1 dated Mar. 11, 2016.

* cited by examiner

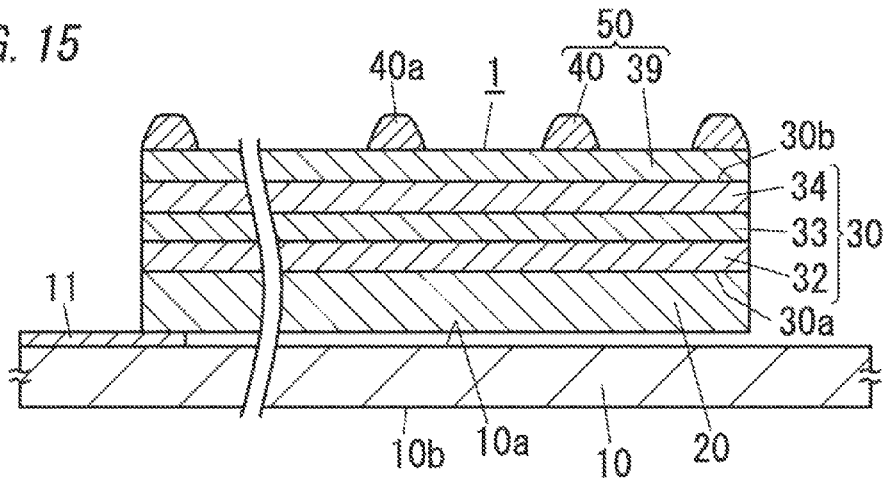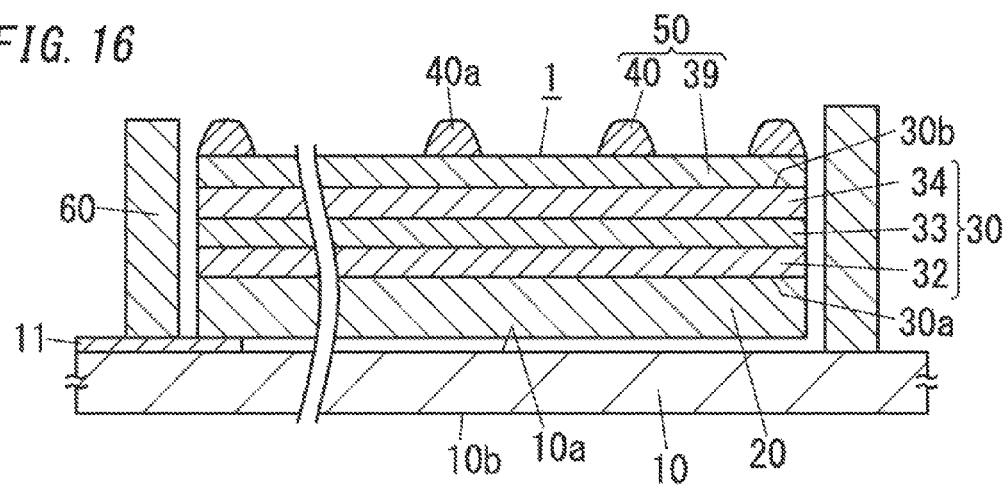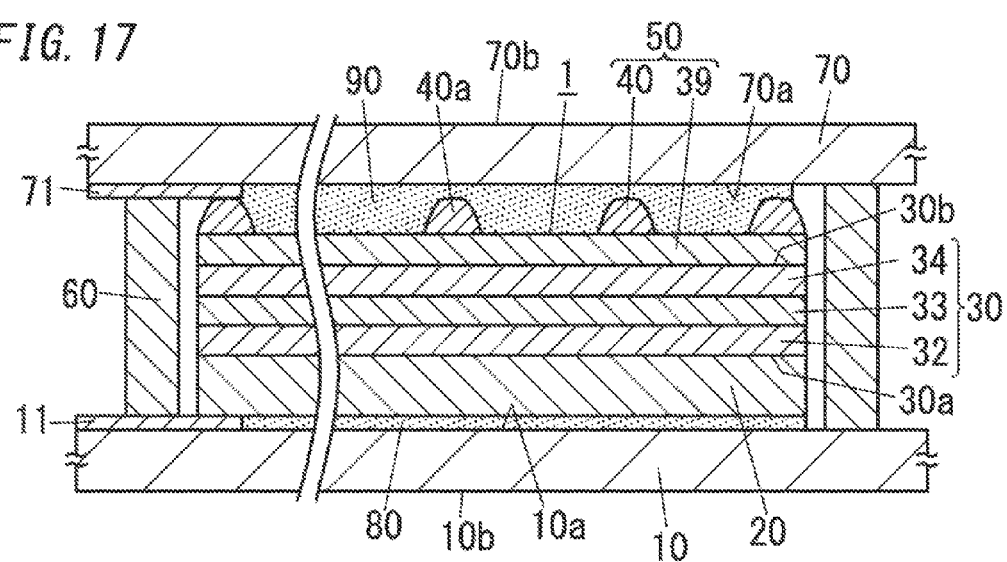

FIG. 18  PRIOR ART
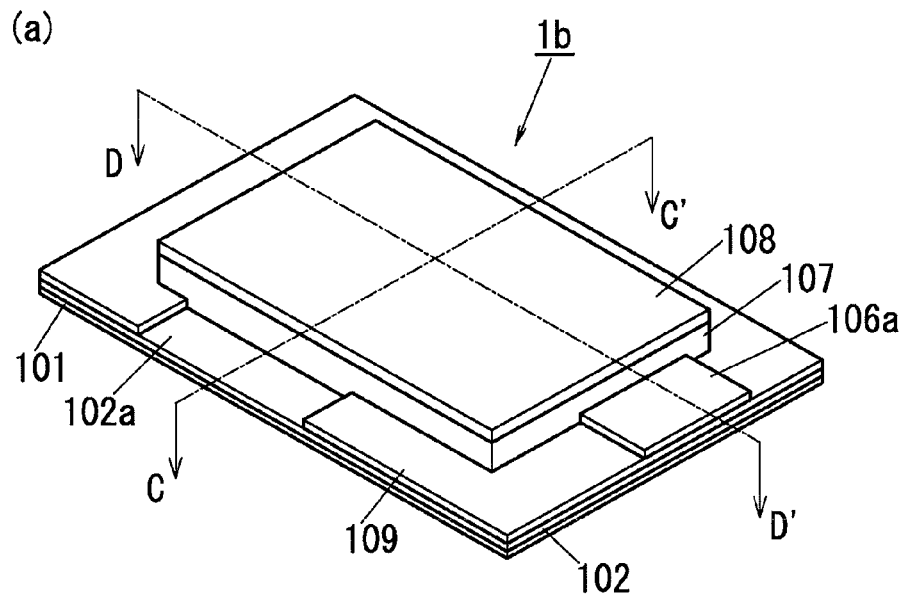
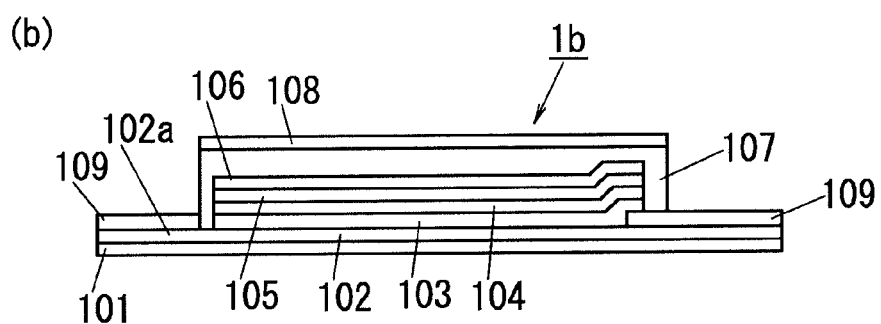
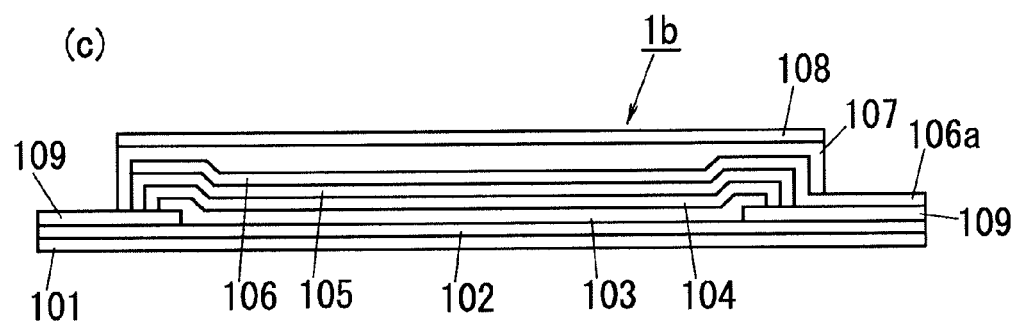

ORGANIC ELECTROLUMINESCENCE ELEMENT AND PRODUCTION METHOD THEREFOR

TECHNICAL FIELD

The present invention relates to organic electroluminescence elements and production methods therefor.

BACKGROUND ART

In the past, there has been proposed an organic electroluminescence element panel (organic EL panel) 1b having a structure illustrated in FIG. 18 (document 1 [WO 2009/025186 A1]).

The organic EL panel 1b has an enclosing structure in which an organic electroluminescence element (organic EL element) is enclosed by an enclosing member 108 with an adhesive 107. The organic EL element has a structure in which a first electrode (anode) 102, a hole transport layer 103, a light-emitting layer 104, a cathode buffer layer (electron injection layer) 105, and a second electrode (cathode) 106 are stacked on a surface of a substrate 101.

Document 1 discloses that the first electrode 102 is formed by forming a film for the first electrode 102 on the entire surface of the substrate 101 and subsequently performing patterning such that an insulating layer 109 exposes a part of the film including an extension electrode 102a and a region for bearing a stack of the hole transport layer 103, the light-emitting layer 104, the cathode buffer layer 105, and the second electrode 106.

SUMMARY OF INVENTION

The present invention has aimed to propose an organic electroluminescence element with an improved property of insulating the first electrode and the second electrode from each other and also propose a production method therefor.

The organic electroluminescence element in accordance with the present invention includes: a first substrate; a second substrate placed to face the first substrate; an element member interposed between the first substrate and the second substrate; a first extension electrode formed on a first inner surface of the first substrate facing the element member; a second extension electrode formed on a second inner surface of the second substrate facing the element member; and an insulating member having an electrically insulating property. The element member includes: a functional layer including a light-emitting layer and having a first surface and a second surface in a thickness direction; a first electrode layer placed on the first surface of the functional layer; and a second electrode layer placed on the second surface of the functional layer. The element member is interposed between the first extension electrode and the second extension electrode such that a part of the first electrode layer is in contact with the first extension electrode and a part of the second electrode layer is in contact with the second extension electrode. The insulating member is interposed between the first inner surface of the first substrate and the second inner surface of the second substrate.

The production method for an organic electroluminescence element in accordance with the present invention includes steps of: preparing an element member which includes: a functional layer including a light-emitting layer and having a first surface and a second surface in a thickness direction; a first electrode layer placed on the first surface of the functional layer; and a second electrode layer placed on the second surface of the functional layer; preparing a first substrate on which a first extension electrode is formed and a second substrate on which a second extension electrode is formed; arranging the element member, the first substrate, and the second substrate in such a manner that the element member is interposed between the first extension electrode and the second extension electrode such that a part of the first electrode layer is in contact with the first extension electrode and a part of the second electrode layer is in contact with the second extension electrode; and bonding the first substrate to the second substrate with an insulating member having an electrically insulating property.

BRIEF DESCRIPTION OF THE DRAWINGS

FIG. 15 is a diagram illustrating the production method for the organic electroluminescence element of the first embodiment;

FIG. 16 is a diagram illustrating the production method for the organic electroluminescence element of the first embodiment;

FIG. 17 is a schematic sectional view illustrating the organic electroluminescence element of the second embodiment; and FIG. 18 relates to the prior organic EL panel and includes (a) illustrating a schematic perspective view thereof, (b) illustrating a schematic sectional view along the line C-C' in (a), and (c) illustrating a schematic sectional view along the line D-D' in (a).

DESCRIPTION OF EMBODIMENTS

Figure 1:
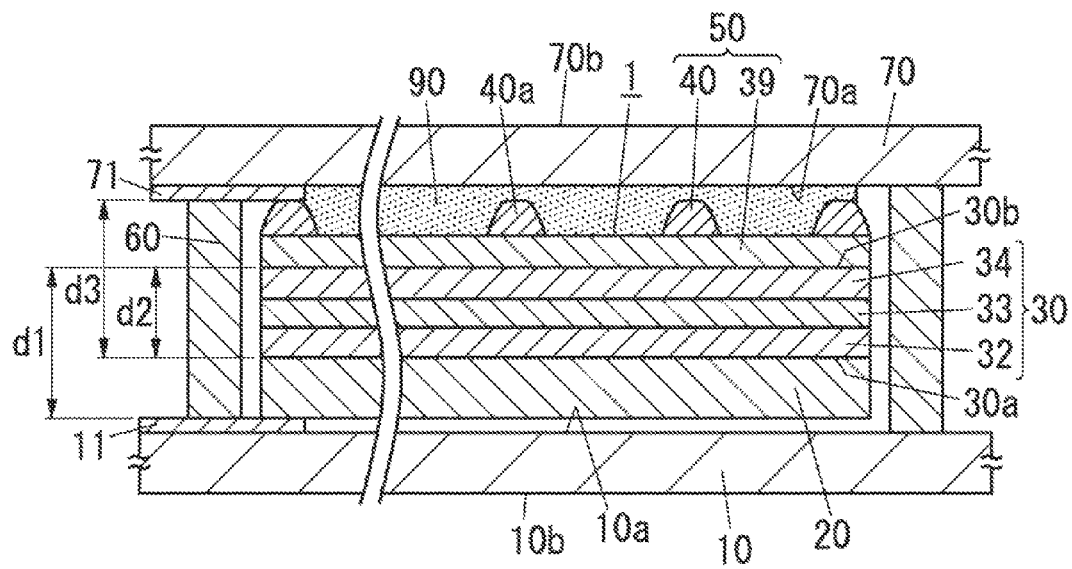
FIG. 1 is a schematic sectional view illustrating the organic electroluminescence element of the first embodiment.

With regard to the prior organic EL panel 1b with the structure illustrated in FIG. 18, since the surface of the first electrode 102 and the surface of the insulating layer 109 are not flush with each other, the stack of the hole transport layer 103, the light-emitting layer 104, the cathode buffer layer 105, and the second electrode 106 is likely to have a thinned part. Hence, a short circuit between the second electrode 106 and the first electrode 102 tends to occur. Further, such a short circuit may be caused by the fact that a distance between the second electrode 106 and the first electrode 102 is short.

In view of the above insufficiency, the present invention has aimed to propose an organic electroluminescence element with an improved property of insulating the first electrode and the second electrode from each other.

(First Embodiment)

The following explanation referring to FIG. 1 to FIG. 16 is made to the organic electroluminescence element of the present embodiment.

As shown in FIG. 1, the organic electroluminescence element includes a first substrate 10, a first electrode 20 on a surface (upper surface in FIG. 1) of the first substrate 10, a second electrode 50 which is over the surface of the first substrate 10 and faces the first electrode 20, and a functional layer 30 which is between the first electrode 20 and the second electrode 50 and includes a light-emitting layer 32. Further, the organic electroluminescence element includes a second substrate 70 which is positioned over the surface of the first substrate 10 in such a way to be away from the second electrode 50 and face the first substrate 10. Additionally, the organic electroluminescence element includes: a first extension electrode 11 electrically connected to the first electrode 20; and a second extension electrode 71 electrically connected to the second electrode 50. The organic electroluminescence element is designed to emit light via the second substrate 70.

The first extension electrode 11 is formed on the surface of the first substrate 10 to extend between an inside and an outside of a projection region of the first electrode 20. Hence, the first extension electrode 11 has a part which is interposed between the surface of the first substrate 10 and a periphery of the first electrode 20. Note that, the organic electroluminescence element of the present embodiment may include a plurality of first extension electrodes 11. In this case, with applying voltage to the plurality of first extension electrodes 11, it is possible to reduce unevenness of luminance of a light-emitting surface.

The second extension electrode 71 is formed on a facing surface of the second substrate 70 which is defined as a surface facing the first substrate 10 to extend between an inside and an outside of a projection region of the second electrode 50. Hence, the second extension electrode 71 has a part which is interposed between the facing surface of the second substrate 70 and a periphery of the second electrode 50. Note that, the organic electroluminescence element of the present embodiment may include a plurality of second extension electrodes 71. In this case, with applying voltage to the plurality of second extension electrodes 71, it is possible to reduce unevenness of luminance of a light-emitting surface.

Moreover, the organic electroluminescence element includes an insulating member 60 interposed between the first extension electrode 11 and the second extension electrode 71. Hence, in the organic electroluminescence element, the first extension electrode 11 and the second extension electrode 71 are electrically insulated from each other by the insulating member 60, and also the first electrode 20 and the second electrode 50 are electrically insulated from each other.

In summary, the organic electroluminescence element of the present embodiment includes: the first substrate 10; the second substrate 70 positioned to face the first substrate 10; an element member 1 interposed between the first substrate 10 and the second substrate 70; the first extension electrode 11 formed on a first inner surface (upper surface in FIG. 1) 10a of the first substrate 10 facing the element member 1; the second extension electrode 71 formed on a second inner surface (lower surface in FIG. 1) 70a of the second substrate 70 facing the element member 1; and the insulating member 60 having an electrically insulating property.

The element member 1 includes: the functional layer 30 including the light-emitting layer 32 and having a first surface (lower surface in FIG. 1) 30a and a second surface (upper surface in FIG. 1) 30b in a thickness direction; the first electrode layer (first electrode) 20 positioned on the first surface 30a of the functional layer 30; and the second electrode layer (second electrode) 50 positioned on the second surface 30b of the functional layer 30.

The element member 1 is interposed between the first extension electrode 11 and the second extension electrode 71 such that a part of the first electrode layer 20 is in contact with the first extension electrode 11 and a part of the second electrode layer 50 is in contact with the second extension electrode 71.

The insulating member 60 is interposed between the first inner surface 10a of the first substrate 10 and the second inner surface 70a of the second substrate 70.

The second electrode 50 includes a conductive polymer layer 39 and a patterned electrode 40. The conductive polymer layer 39 is in contact with the functional layer 30. The patterned electrode 40 is on an opposite side of the conductive polymer layer 39 from the functional layer 30, and includes an opening part 41 (see FIG. 2 and FIG. 3) for allowing passage of light from the functional layer 30. In summary, the second electrode 50 includes the opening part 41 for passage of light emitted from the functional layer 30.

In other words, the second electrode 50 includes the patterned electrode 40, and the conductive polymer layer (electrically conductive layer) 39. The patterned electrode 40 includes the electrode part 40a covering the second surface 30b of the functional layer 30, and the opening part 41 formed in the electrode part 40a to expose the second surface 30b of the functional layer 30. The electrically conductive layer 39 is made of material allowing passage of light emitted from the light-emitting layer 32. The electrically conductive layer 39 is interposed between the second surface 30b of the functional layer 30 and the patterned electrode 40 so as to cover the second surface 30b of the functional layer 30. In the present embodiment, the patterned electrode 40 includes a plurality of opening parts 41. Note that, in the description to the embodiments of the present invention, the term "cover" means not only "cover something with being in direct contact with it" but also "cover something without being in direct contact with it with another layer being interposed". In summary, the expression that the first layer "covers" the second layer means a situation where the second layer is positioned directly on the first layer or positioned on the first layer with the third layer being interposed between the first layer and the second layer.

In the organic electroluminescence element, each of the first electrode 20 and the patterned electrode 40 of the second electrode 50 has a resistivity (electrical resistivity) lower than a resistivity (electrical resistivity) of a transparent conducting oxide (TCO). Examples of the transparent conductive oxide include ITO, AZO, GZO, and IZO.

Preferably, the organic electroluminescence element includes a resin layer 90 which allows light to pass through and has a refractive index equal to a refractive index of the conductive polymer layer 39 or more and is interposed between the second electrode 50 and the second substrate 70.

With this configuration, the organic electroluminescence element can emit light via the second electrode 50, the resin layer 90, and the second substrate 70. In brief, the organic electroluminescence element of the present embodiment can be used as a top emission type organic electroluminescence element.

In the organic electroluminescence element, it is preferable that the insulating member 60 described above be formed into a frame shape (rectangular frame shape in the present embodiment) to be interposed between an entire periphery of the surface of the first substrate 10 and an entire periphery of the facing surface of the second substrate 70. In other words, the insulating member 60, the first substrate 10, and the second substrate 70 are designed to constitute a housing designed to enclose the element member 1 in an air-tight manner.

The following is a detailed explanation made to each component of the organic electroluminescence element.

The first substrate 10 is formed into a rectangular shape in a plan view. Note that, the shape of the first substrate 10 in a plan view is not limited to a rectangular shape, but may be a polygonal shape other than the rectangular shape, a circular shape or the like.

The first substrate 10 is formed of a glass substrate, but is not limited thereto. For example, a plastic plate or the like may be used for the first substrate 10. Examples of materials of the glass substrate include soda-lime glass and non-alkali glass and the like. Examples of materials of the plastic plate include polyethylene terephthalate, polyethylene naphthalate, poly ether sulfone, polycarbonate and the like. As to the plastic plate, in order to suppress the transmission of water, it is preferred to use a plastic plate including a plastic substrate and an SiON film, an SiN film or the like, formed on the plastic substrate. The first substrate 10 may be rigid or flexible.

The first electrode 20 is formed into a rectangular shape in a plan view. Note that, the shape of the first electrode 20 in a plan view is not limited to a rectangular shape, but may be a polygonal shape other than the rectangular shape, a circular shape or the like.

The first electrode 20 is formed of a metal foil. The first electrode 20 may be constituted by a metal foil and an electrically conductive layer formed on a surface of the metal foil.

Material of the metal foil may be copper, stainless steel, or aluminum, for example.

In a case where the first electrode 20 serves as a cathode, examples of materials of the electrically conductive layer may include aluminum, silver, magnesium, gold, copper, chromium, molybdenum, palladium, tin, and alloy of these and other metal such as magnesium-silver mixture, magnesium-indium mixture, aluminum-lithium alloy and the like. The cathode may be formed of laminated film including a thin film made of aluminum and an ultrathin film (a thin film having a thickness of 1 nm or less so as to allow an electron to flow with tunneling injection) made of aluminum oxide, for example. Such an ultrathin film may be made of metal, metal oxide, or mixture of these and other metal.

Since the first electrode 20 serves as a reflective electrode, it is preferable that the electrically conductive layer be made of metal having high reflectance with respect to light emitted from the light-emitting layer 32 and having a low resistivity, such as aluminum and silver.

With regard to the first electrode 20, irregularity of the surface of the first electrode 20 close to the functional layer 30 may cause a leak current of the organic electroluminescence element (i.e. may cause deterioration of the organic electroluminescence element). Therefore, with regard to a surface roughness of the surface of the first electrode 20, an arithmetic average roughness Ra defined in JIS B 0601-2001 (ISO 4287-1997) is preferably 10 nm or less and is more preferably several nm or less.

In the organic electroluminescence element of the present embodiment, the first electrode 20 serves as a cathode and the second electrode 50 serves as an anode. In this case, first carriers injected from the first electrode 20 into the functional layer 30 are electrons and second carriers injected from the second electrode 50 into the functional layer 30 are holes. The functional layer 30 includes the light-emitting layer 32, a second carrier transport layer 33, and a second carrier injection layer 34 which are arranged in this order from the first electrode 20.

In this regard, the second carrier transport layer 33 and the second carrier injection layer 34 serve as a hole transport layer and a hole injection layer, respectively. In an alternative case where the first electrode 20 serves as an anode and the second electrode 50 serves as a cathode, an electron transport layer may be used as the second carrier transport layer 33 and an electron injection layer may be used as the second carrier injection layer 34.

The structure of the functional layer 30 described above is not limited to the example illustrated in FIG. 1. For example, at least one of a first carrier injection layer and a first carrier transport layer may be interposed between the first electrode 20 and the light-emitting layer 32 and additionally an interlayer may be interposed between the light-emitting layer 32 and the second carrier transport layer 33. In a case where the first electrode 20 serves as a cathode and the second electrode 50 serves as an anode, the first carrier injection layer serves as an electron injection layer and the first carrier transport layer serves as an electron transport layer.

Further, the functional layer 30 is only required to include at least the light-emitting layer 32 (i.e., the functional layer 30 may include only the light-emitting layer 32). Components other than the light-emitting layer 32, namely, the first carrier injection layer, the first carrier transport layer, the interlayer, the second carrier transport layer 33, the second carrier injection layer 34 and the like are optional. In brief, it is sufficient that the functional layer 30 is configured to emit light in response application of a predetermined voltage between the first electrode layer (first electrode) 20 and the second electrode layer (second electrode) 50.

The light-emitting layer 32 may be either a single-layer structure or a multilayer structure. In a case where white light is required, the light-emitting layer may be doped with three kinds of dye materials, i.e. red, green, blue dyes; may have a laminate structure including a blue light-emitting layer with a hole transport property, a green light-emitting layer with an electron transport property and a red light-emitting layer with an electron transport property; or may have a laminate structure including a blue light-emitting layer with an electron transport property, a green light-emitting layer with an electron transport property and a red light-emitting layer with an electron transport property.

Examples of materials of the light-emitting layer 32 include poly(p-phenylenevinylene) derivative, polythiophene derivative, poly(p-phenylene) derivative, polysilane derivative, and polyacetylene derivative; polymerized compound of such as polyfluorene derivative, polyvinyl carbazole derivative, chromoporic material, and luminescnce material of metal complexes; anthracene, naphthalene, pyrene, tetracene, coronene, perylene, phthaloperylene, naphthaloperylene, diphenylbutadiene, tetraphenylbutadiene, coumalin, oxadiazole, bisbenzoxazoline, bisstyryl, cyclopentadiene, coumalin, oxadiazol, bis benzo ide quinazoline, Bisusuchiriru, cyclopentadiene, quinoline-metal complex, tris(8-hydroxyquinolinate)aluminum complex, tris(4-methyl-8-quinolinate)aluminum complex, tris(5-phenyl-8-quinolinate)aluminum complex, aminoquinoline-metal complex, benzoquinoline-metal complex, tri-(p-terphenyl-4-yl)amine, pyrane, quinacridone, rubrene and their derivatives; 1-aryl-2,5-di(2-thienyl)pyrrole derivative, distyrylbenzene derivative, distyrylarylene derivative, styrylarylene derivative, styrylamine derivative, and various compounds containing a group (radical) that is formed of the above-listed luminescent material.

The material of the light-emitting layer 32 is not limited to compounds based on fluorescent dye listed above, and examples of materials of the light-emitting layer 32 include so-called phosphorescent material such as iridium complex, osmium complex, platinum complex, europium complex, and compounds or polymer molecules containing one of these complexes.

One or more materials listed above can be selected and used as necessary. The light-emitting layer 32 is preferably formed into a film shape with a wet process such as a coating method (e.g., a spin coating method, spray coating method, dye coating method, gravure printing method, and screen printing method). However, the light-emitting layer 32 may be formed into a film shape with a dry process such as a vacuum vapor deposition method and a transfer method as well as by the coating method.

Examples of materials of the electron injection layer include metal fluorides (e.g., lithium fluoride and magnesium fluoride), metal halide compounds (e.g., metal chlorides typified by sodium chloride and magnesium chloride) and oxides such as titanium oxide, zinc oxide, magnesium oxide, calcium oxide, barium oxide and strontium oxide. In the case where these materials are used, the electron injection layer can be formed with a vacuum vapor deposition method.

Also, the electron injection layer can be made of an organic semiconductor material doped with dopant (such as alkali metal) for promoting electron injection. In the case where such material is used, the electron injection layer can be formed with a coating method.

Material of the electron transport layer can be selected from the group of compounds that allow electron transport. Examples of such types of compounds may include a metal complex that is known as electron transporting material (e.g., Alq3), and compounds having a heterocycle (e.g., phenanthroline derivatives, pyridine derivatives, tetrazine derivatives, and oxadiazole derivatives), but are not limited thereto, and any electron transport material that is generally known can be used.

The hole transport layer can be made of low-molecular material or polymeric material having a comparatively low LUMO (Lowest Unoccupied Molecular Orbital) level. Examples of materials of the hole transport layer include polymer containing aromatic amine such as polyarylene derivative containing aromatic amine on the side chain or the main chain, e.g., polyvinyl carbazole (PVCz), polypyridine, polyaniline and the like. However, the material of the hole transport layer is not limited thereto. Note that, examples of materials of the hole transport layer include 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4"-tris(N-(3-methylphenyl)N-phenylamino)triphenylamine (MTDATA), 4,4'-N,N'-dicarbazolebiphenyl (CBP), spiro-NPD, spiro-TPD, spiro-TAD, TNB and the like.

Examples of materials of the hole injection layer include organic material containing thiophene, triphenylmethane, hydrazoline, amylamine, hydrazone, stilbene, triphenylamine and the like. In detail, examples of materials of the hole injection layer include aromatic amine derivative such as polyvinyl carbazole, polyethylenedioxythiophene:polystyrenesulfonate (PEDOT:PSS), TPD and the like. These materials can be used alone or in combination of two or more. The hole injection layer mentioned above can be formed into a film shape with a wet process such as a coating method (e.g., a spin coating method, spray coating method, dye coating method, and gravure printing method).

It is preferable that the interlayer has a carrier blocking function (in this configuration, an electron blocking function) of serving as a first carrier barrier (in this configuration, an electron barrier) which suppresses leakage of the first carrier (in this configuration, an electron) from the light-emitting layer 32 to the second electrode 50. Further, it is preferable that the interlayer 33 has a function of transporting the second carrier (in this configuration, a hole) to the light-emitting layer 32, and a function of preventing quenching of an excited state of the light-emitting layer 32. Note that, in the present embodiment, the interlayer 33 serves as an electron blocking layer which suppresses leakage of an electron from the light-emitting layer 32.

In the organic electroluminescence element, with providing the interlayer, it is possible to improve the luminous efficiency and prolong the lifetime. Examples of materials of the interlayer include polyarylamine and derivative thereof, polyfluorene and derivative thereof, polyvinyl carbazole and derivative thereof, and triphenyldiamine derivative. The interlayer as mentioned above can be formed into a film shape with a wet process such as a coating method (e.g., a spin coating method, spray coating method, dye coating method, and gravure printing method).

The cathode is an electrode for injecting electrons (first carriers) treated as first charges into the functional layer 30. In the case where the first electrode 20 serves as a cathode, the cathode is preferably made of an electrode material such as metal, alloy, or electrically conductive compound that has a small work function, and a mixture thereof. Further, it is preferable that the cathode is made of material having a work function of 1.9 eV or more to 5 eV or less in order to limit a difference between an energy level of the cathode and an LUMO (Lowest Unoccupied Molecular Orbital) level within an appropriate range.

Examples of the electrode material of the cathode include aluminum, silver, magnesium, gold, copper, chrome, molybdenum, palladium, tin, and alloy of these and other metal such as magnesium-silver mixture, magnesium-indium mixture, aluminum-lithium alloy and the like.

The cathode may be formed of laminated film including a thin film made of aluminum and an ultrathin film (a thin film having a thickness of 1 nm or less so as to allow an electron to flow with tunneling injection) made of aluminum oxide, for example. Such an ultrathin film may be made of metal, metal oxide, or mixture of these and other metal. In a case where the cathode is designed as a reflective electrode, it is preferable that the cathode be made of metal having high reflectance with respect to the light emitted from the light-emitting layer 32 and having a low resistivity, such as aluminum and silver.

Note that, in a case where the first electrode 20 is the anode that serves as the electrode for injecting a hole (second carrier) treated as the second charge into the functional layer 30, the first electrode 20 is preferably made of metal having a large work function. Further it is preferable that the anode is made of material having a work function of 4 eV or more to 6 eV or less in order to limit a difference between an energy level of the first electrode 20 and an HOMO (Highest Occupied Molecular Orbital) level within an appropriate range.

The conductive polymer layer 39 of the second electrode 50 may be made of a conductive polymer material such as polythiophene, polyaniline, polypyrrole, polyphenylene, polyphenylenevinylene, polyacetylene, and polycarbazole.

For the purpose of improving the conductivity, the conductive polymer material of the conductive polymer layer 39 may be doped with a dopant such as sulfonate acid, Lewis acid, proton acid, alkali metal, and alkali earth metal.

In this regard, it is preferable that the conductive polymer layer 39 have a lower resistivity. The electrical conductivity of the whole in a lateral direction (in-plane direction) thereof is improved with a decrease in the resistivity. Hence, it is possible to suppress an in-plane variation in a current flowing through the light-emitting layer 32, and therefore the luminance unevenness can be reduced.

The patterned electrode 40 of the second electrode 50 is an electrode made of material including metal powder and an organic binder. Examples of such kind of metal include silver, gold, and copper. Thus, in the organic electroluminescence element, the patterned electrode 40 of the second electrode 50 can have a resistivity and a sheet resistance that are lower than those of the second electrode 50 provided as a thin film made of the electrically conductive transparent oxide. Hence, the luminance unevenness can be reduced. Note that, the electrically conductive material of the patterned electrode 40 of the second electrode 50 may be selected from alloy and carbon black, as substitute for metal.

For example, the patterned electrode 40 can be formed by printing, with a screen printing method or a gravure printing method, paste (printing ink) prepared by mixing metal powder with a set of an organic binder and an organic solvent.

Examples of materials of the organic binder include acrylic resin, polyethylene, polypropylene, polyethylene terephthalate, polymethylmethacrylate, polystyrene, polyether sulfone, polyarylate, polycarbonate resin, polyurethane, polyacrylonitrile, polyvinyl acetal, polyamide, polyimide, diacryl phthalate resin, cellulosic resin, polyvinyl chloride, polyvinylidene chloride, polyvinyl acetate, other thermoplastic resin, and copolymer containing at least different two of monomers constituting the above-listed resin. Note that, the material of the organic binder is not limited thereto.

Note that in the organic electroluminescence element of the present embodiment, the thickness of the first electrode 20 is selected to be within a range of 80 nm to 200 nm, and the thickness of the light-emitting layer 32 is selected to be within a range of 60 nm to 200 nm, and the thickness of the second carrier transport layer 33 is selected to be within a range of 5 nm to 30 nm, and the thickness of the second carrier injection layer 34 is selected to be within a range of 10 nm to 60 nm, and the thickness of the conductive polymer layer 39 is selected to be within a range of 200 nm to 400 nm. However, the aforementioned values are only examples and the thicknesses thereof are not limited particularly.

Figure 2:
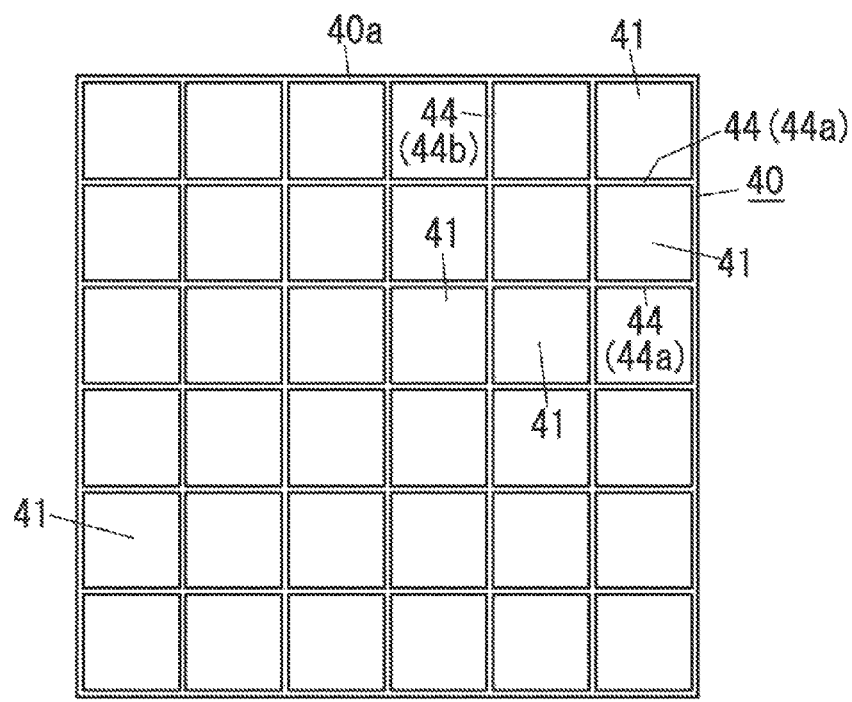
FIG. 2 is a schematic plan view illustrating the patterned electrode of the organic electroluminescence element of the first embodiment.
Figure 3:
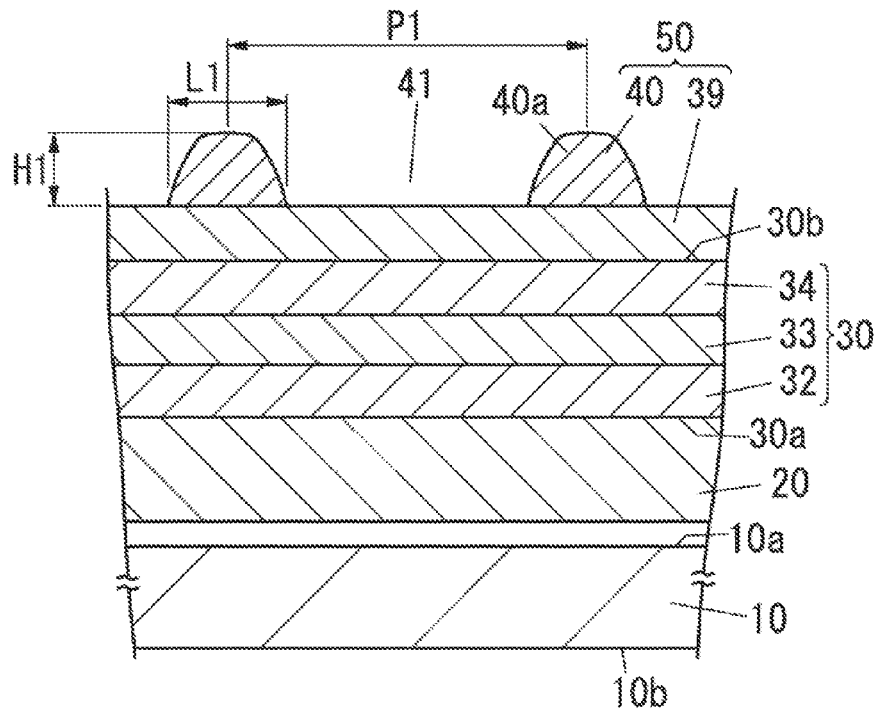
FIG. 3 is a schematic sectional view illustrating the primary part of the organic electroluminescence element of the first embodiment.

The patterned electrode 40 is formed into a grid shape (a net-like shape) as shown in FIG. 1 to FIG. 3 and includes a plurality (6*6=36 in the instance shown in FIG. 2) of opening parts 41. In this regard, in the patterned electrode 40 shown in FIG. 2, each opening part 41 has a square shape when viewed in a plane. In brief, the patterned electrode 40 shown in FIG. 2 is formed into a square grid shape.

In the patterned electrode 40 shown in FIG. 2, the electrode part 40a includes a plurality of narrow line parts 44 (44a) extending in a first direction (left and right direction in FIG. 2), and a plurality of narrow line parts 44 (44b) extending in a second direction (upward and downward direction in FIG. 2) perpendicular to the first direction. The plurality of (seven, in the illustrated instance) narrow line parts 44a are arranged at regular intervals in the second direction. The plurality of (seven, in the illustrated instance) narrow line parts 44b are arranged at regular intervals in the first direction. The plurality of narrow line parts 44a and the plurality of narrow line parts 44b are perpendicular to each other. In the patterned electrode 40 shown in FIG. 2, a space enclosed by the adjacent narrow line parts 44a and 44a and the adjacent narrow line parts 44b and 44b defines the opening part 41.

In the second electrode 50, with regard to the dimensions of the patterned electrode 40 that has a square grid shape, for example, a line width L1 (see FIG. 3) is within a range of 1 μm to 100 μm, and a height H1 (see FIG. 4) is within a range of 50 nm to 100 μm, and a pitch P1 (see FIG. 3) is within a range of 100 μm to 2000 μm.

However, respective value ranges of the line width L1, the height H1 and the pitch P1 of the patterned electrode 40 of the second electrode 50 are not definite particularly, but may be selected appropriately based on the size in the plan view of the element member 1 constituted by the first electrode 20, the functional layer 30, and the second electrode 50.

In this regard, to improve the use efficiency of the light produced in the light-emitting layer 32, it is preferable that the line width L1 of the patterned electrode 40 of the second electrode 50 is decreased. In contrast, to suppress the luminance unevenness by decreasing the resistance of the second electrode 50, it is preferable that the patterned electrode 40 have the broader line width L1. Hence, it is preferable that the line width L1 is appropriately selected depending on the planar size of the organic electroluminescence element, for example.

Further, it is preferable that the height H1 of the patterned electrode 40 of the second electrode 50 is within a range of 100 nm to 10 μm. This range may be selected in view of: decreasing the resistance of the second electrode 50; improving the efficient use of the material (material use efficiency) of the patterned electrode 40 in a process of forming the patterned electrode 40 with a coating method such as a screen printing method; and selecting an appropriate radiation angle of the light emitted from the functional layer 30.

Furthermore, in the organic electroluminescence element of the present embodiment, as shown in FIG. 1 and FIG. 3, each opening part 41 in the patterned electrode 40 is formed into such an opening shape that an opening area is gradually increased with an increase in a distance from the functional layer 30.

Thus, in the organic electroluminescence element, a spread angle of the light emitted from the functional layer 30 can be increased and therefore the luminance unevenness can be more reduced. Furthermore, in the organic electroluminescence element, it is possible to reduce a reflection loss and an absorption loss at the patterned electrode 40 of the second electrode 50. Therefore, the external quantum efficiency of the organic electroluminescence element can be more improved.

In a case where the patterned electrode 40 is formed into a grid shape, the shape of each opening part 41 is not limited to a square shape, but may be a rectangular shape, an equilateral triangle shape, or a regular hexagonal shape, for example.

In a case where the shape of each opening part 41 is an equilateral triangle shape, the patterned electrode 40 is formed into a triangle grid shape. In a case where the shape of each opening part 41 is a regular hexagonal shape, the patterned electrode 40 is formed into a hexagonal grid shape. Note that the shape of the patterned electrode 40 is not limited to a grid shape, but may be a comb shape, for example. The patterned electrode 40 may also be constituted by a set of two patterned electrodes each formed into a comb shape. In brief, the organic electroluminescence element may include a plurality of patterned electrodes 40.

Further, the number of opening parts 41 of the patterned electrode 40 is not particularly limited, but may be one or more. For example, in the case where the patterned electrode 40 has a comb shape or the patterned electrode 40 is constituted by the two patterned electrodes each having a comb shape, the number of opening part 41 can be one.

Figure 4:
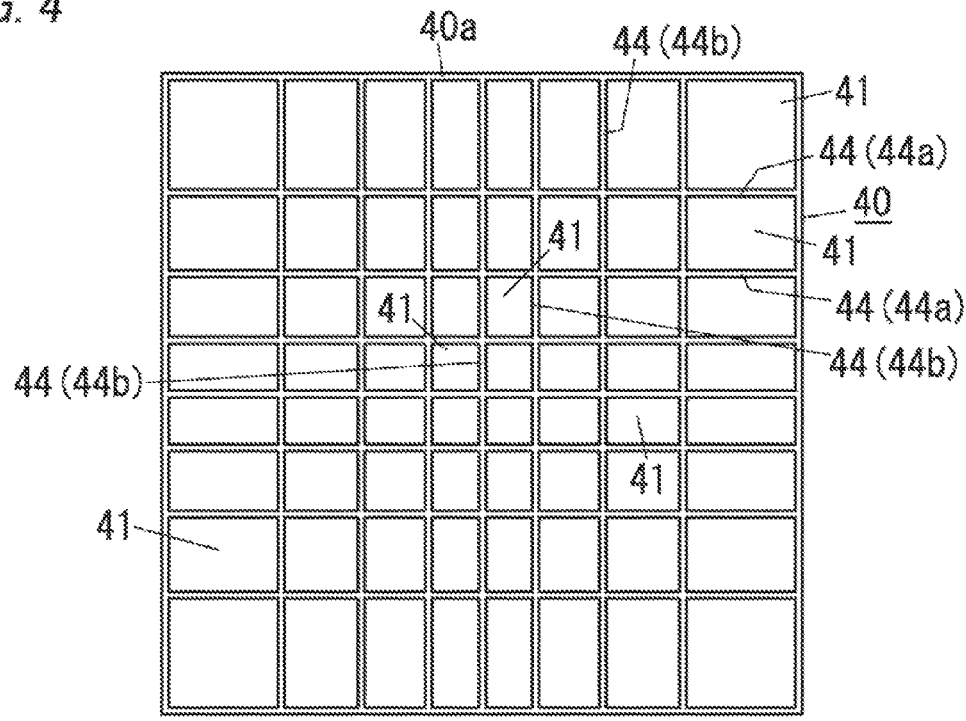
FIG. 4 is a schematic plan view illustrating another configuration example of the patterned electrode of the organic electroluminescence element of the first embodiment.

Further, the patterned electrode 40 may be formed to have a planar shape shown in FIG. 4, for example. That is, the patterned electrode 40 may be formed into such a shape in a plan view that the straight narrow line parts 44 of the patterned electrode 40*a* have the same line width and the opening area of the opening part 41 is decreased by decreasing the interval between the adjacent narrow line parts 44 with an increase in a distance from the periphery of the patterned electrode 40.

In the patterned electrode 40 shown in FIG. 4, a plurality (nine, in the illustrated instance) of narrow line parts 44*a* are arranged in a second direction (upward and downward direction in FIG. 5) such that an interval between the narrow line parts 44*a* becomes shorter towards the center than at the edge of the electrode part 40*a*. A plurality (nine, in the illustrated instance) of narrow line parts 44*b* are arranged in a first direction (left and right direction in FIG. 5) such that an interval between the narrow line parts 44*b* becomes shorter towards the center than at the edge of the electrode part 40*a*.

In the organic electroluminescence element, the patterned electrode 40 of the second electrode 50 is formed into the planar shape shown in FIG. 4 and, therefore, in contrast to the case where the patterned electrode 40 is formed into the planar shape shown in FIG. 2, it is possible to improve the luminous efficiency of the second electrode 50 at the center which is farther from the second extension electrode 71 (see FIG. 1) than the periphery is. Consequently, the external quantum efficiency of the organic electroluminescence element can be improved.

Further, in the organic electroluminescence element, since the patterned electrode 40 of the second electrode 50 is formed into the planar shape shown in FIG. 4, in contrast to a case where the patterned electrode 40 is formed into the planer shape shown in FIG. 2, it is possible to suppress current crowding at a periphery of the functional layer 30 which is close to the first extension electrode 11 and the second extension electrode 71. Consequently, the lifetime of the organic electroluminescence element can be extended.

Figure 5:
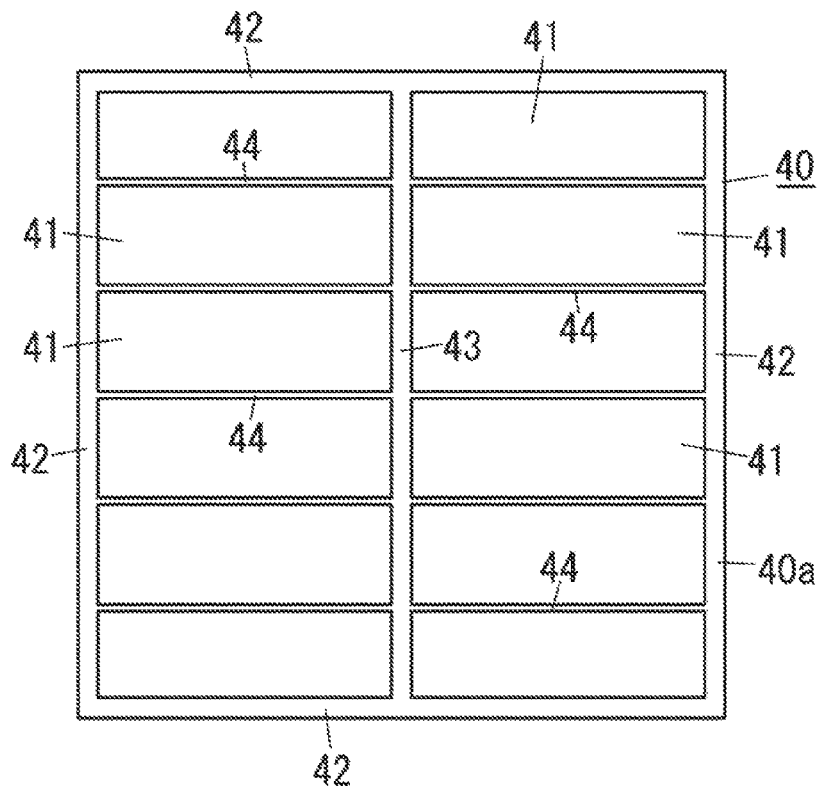
FIG. 5 is a schematic plan view illustrating another configuration example of the patterned electrode of the organic electroluminescence element of the first embodiment.

Further, the patterned electrode 40 of the second electrode 50 may be formed to have a planar shape shown in FIG. 5, for example. In other words, the patterned electrode 40 is formed such that in a plan view widths of four first narrow line parts 42 defining the periphery of the patterned electrode 40 and a width of a single second narrow line part 43 located at the center in a left and right direction of FIG. 5 are greater than a width of a narrow line part (third narrow line part) 44 located between the first narrow line part 42 and the second narrow line part 43.

In the organic electroluminescence element, since the patterned electrode 40 of the second electrode 50 is formed into the planar shape shown in FIG. 5, in contrast to a case where the patterned electrode 50 is formed into the planar shape shown in FIG. 2, it is possible to improve the luminous efficiency of the second electrode 50 at the center which is farther from the second extension electrode 71 (see FIG. 1) than the periphery is. Consequently, the external quantum efficiency of the organic electroluminescence element can be improved.

Note that, in the case where the patterned electrode 40 is formed into the planar shape shown in FIG. 5, with increasing the heights of the first narrow line part 42 and the second narrow line part 43 that have the relatively large widths to be greater than the height of the third narrow line part 44, it is possible to more decrease the resistances of the first narrow line part 42 and the second narrow line part 43.

The present embodiment describes the second electrode 50 having a laminated structure of the conductive polymer layer 39 and the patterned electrode 40. The second electrode 50 may be a single layer of a transparent conducting layer such as ITO layer and a thin metal film or may be a laminated layer of these layers.

The second substrate 70 is formed of a glass substrate, but is not limited thereto. For example, a plastic plate or the like may be used for the second substrate 70. Examples of materials of the glass substrate include soda-lime glass, non-alkali glass and the like. Examples of material of the plastic plate include polyethylene terephthalate, polyethylene naphthalate, poly ether sulfone, polycarbonate and the like. Note that, in a case where the first substrate 10 is formed of a glass substrate, the second substrate 70 is preferably formed of the same material of the first substrate 10, that is, a glass substrate. Further, the second substrate 70 is formed into a flat plate shape.

It is preferable that a light transmissive resin used as material of the resin layer 90 have a refractive index not smaller than a refractive index of material of the conductive polymer layer 39 of the second electrode 50. Such a light transmissive resin may be an imide resin modified to have a higher refractive index, for example.

The first extension electrode 11 may be made of material such as copper, aluminum, silver, and gold. The first extension electrode 11 is not limited to a single layer but may be a multiple layer constituted by two or more layers.

The second extension electrode 71 may be made of material such as copper, aluminum, silver, and gold. The second extension electrode 71 is not limited to a single layer but may be a multiple layer constituted by two or more layers.

Figure 6:
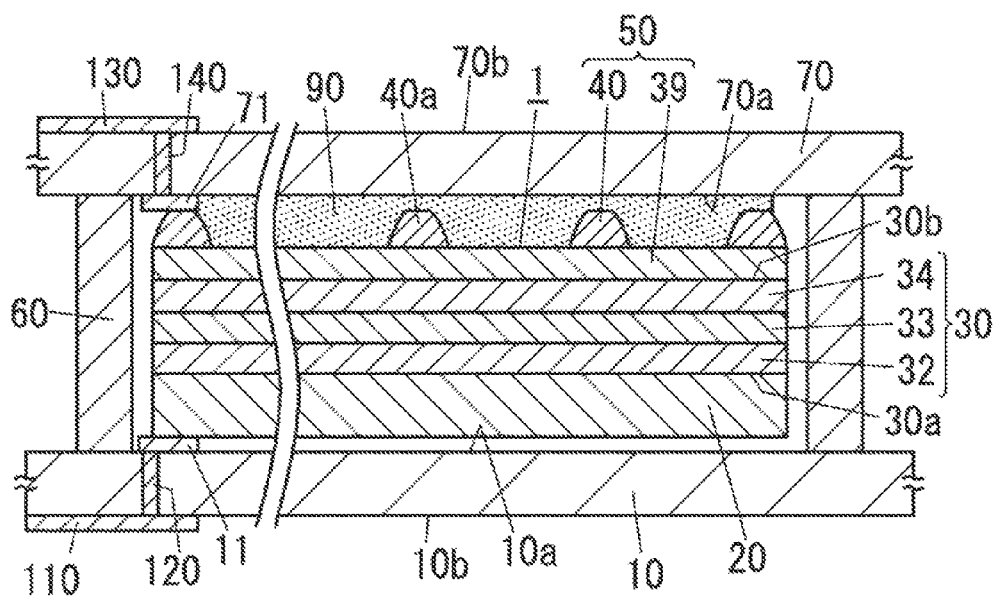
FIG. 6 is a schematic sectional view illustrating the first modification of the organic electroluminescence element of the first embodiment.

FIG. 6 shows the first modification of the organic electroluminescence element of the present embodiment. In the first modification, a first through wire 120 is on the first substrate 10 and is electrically connected to the first extension electrode 11, and a first terminal 110 is on a second surface (lower surface in FIG. 6) 10b of the first substrate 10 and is electrically connected to the first through wire 120. Thus, the first terminal 110 which is used for supplying power to the first electrode 20 is electrically connected to the first electrode 20 through the first through wire 120 and the first extension electrode 11.

In other words, the first modification further includes the first terminal 110. The first substrate 10 has the first outer surface (lower surface in FIG. 6) 10b which is an opposite surface of the first substrate 10 from the first inner surface (upper surface in FIG. 6) 10a. The first terminal 110 is formed on the first outer surface 10b of the first substrate 10. Formed in the first substrate 10 is the first through wire 120 electrically connecting the first extension electrode 11 to the first terminal 110.

Accordingly, the first modification can successfully prevent a short circuit between the first terminal 110 and the second extension electrode 71 (a second terminal 130 connected to the second extension electrode 71).

In the first modification of the organic electroluminescence element of the present embodiment, a second through wire 140 is on the second substrate 70 and is electrically connected to the second extension electrode 71, and the second terminal 130 is on a second surface (upper surface in FIG. 6) 70b of the second substrate 70 and is electrically connected to the second through wire 140. Thus, the second terminal 130 which is used for supplying power to the second electrode 50 is electrically connected to the second electrode 50 through the second through wire 140 and the second extension electrode 71.

In other words, the first modification further includes the second terminal 130. The second substrate 70 has the second outer surface (upper surface in FIG. 6) 70b which is an opposite surface of the second substrate 70 from the second inner surface (lower surface in FIG. 6) 70a. The second terminal 130 is formed on the second outer surface 70b of the second substrate 70. Formed in the second substrate 70 is the second through wire 140 electrically connecting the second extension electrode 71 to the second terminal 130.

Accordingly, the first modification can successfully prevent a short circuit between the second terminal 130 and the first extension electrode 11 (the first terminal 110 connected to the first extension electrode 11).

In the organic electroluminescence element of the present embodiment, the first terminal 110 and the second terminal 130 are on the opposite surfaces of the first substrate 10 and the second substrate 70 from each other, respectively. Hence, it is possible to successfully prevent a short circuit between the first terminal 110 and the second terminal 130.

Note that, arrangement of the first terminal and the second terminal is not limited to the above instance.

Figure 7:
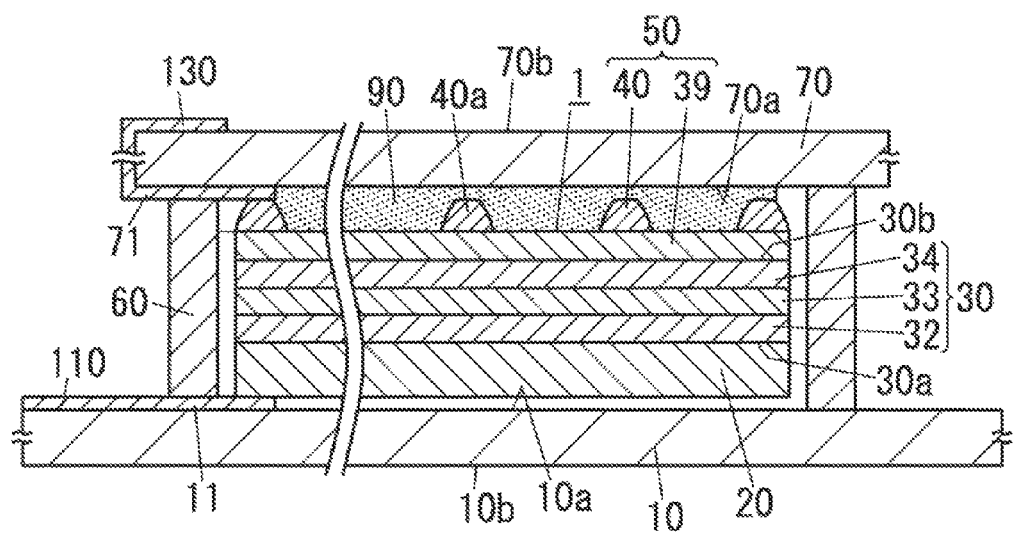
FIG. 7 is a schematic sectional view illustrating the second modification of the organic electroluminescence element of the first embodiment.
Figure 8:
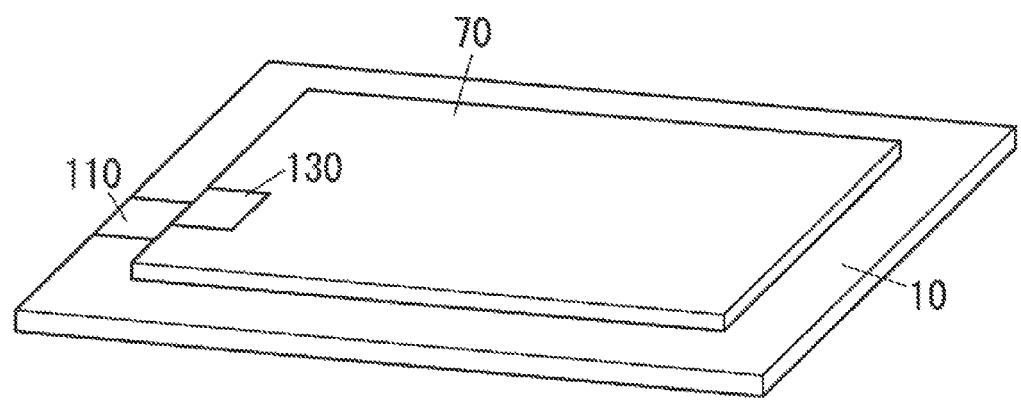
FIG. 8 is a schematic perspective view illustrating the second modification of the organic electroluminescence element of the first embodiment.

FIG. 7 and FIG. 8 show the second modification of the organic electroluminescence element of the present embodiment. In the second modification, the first substrate 10 has a planar size greater than a planar size of the second substrate 70 to allow the first extension electrode 11 to have a part which does not overlap the second substrate 70 in a plan view, and this part is used as the first terminal 110. Further, the second terminal 130 is on the second outer surface 70b of the second substrate 70 to be electrically connected to the second extension electrode 71. Thus, it is possible to connect external wires to the first terminal 110 and the second terminal 130 at the same side of the organic electroluminescence element.

Note that, with regard to arrangement of the first terminal 110 and the second terminal 130, a structure obtained by inverting the structure shown in FIG. 7 in the upward and downward direction with the exception of the element member 1 is available. For example, the second substrate 70 may have a planar size greater than a planar size of the first substrate 10 to allow the second extension electrode 71 to have a part which does not overlap the first substrate 10 in a plan view, and this part may be used as the second terminal 130. Further, the first terminal 110 may be on the first outer surface 10b of the first substrate 10 to be electrically connected to the first extension electrode 11. Also with this configuration, it is possible to connect external wires to the first terminal 110 and the second terminal 130 at the same side of the organic electroluminescence element.

Figure 9:
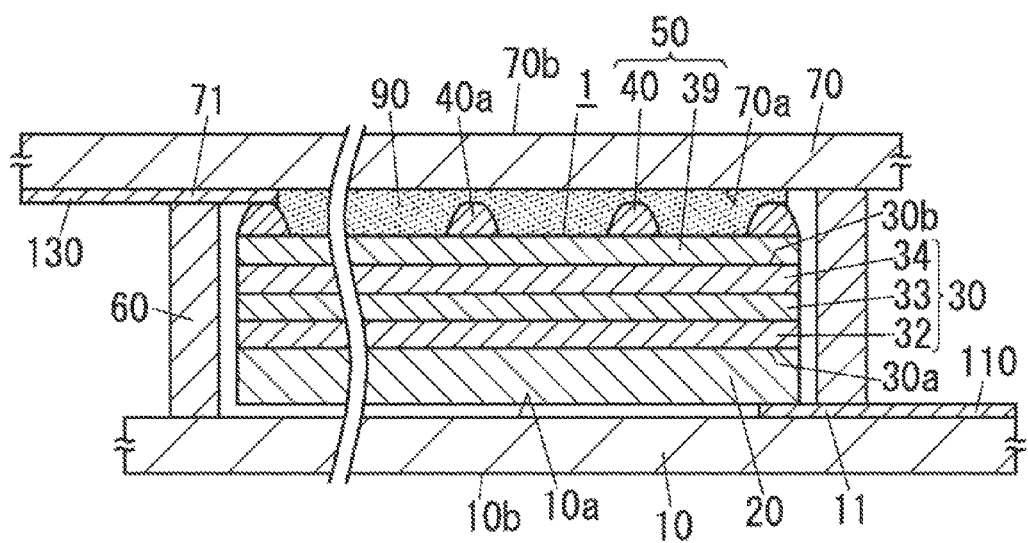
FIG. 9 is a schematic sectional view illustrating the third modification of the organic electroluminescence element of the first embodiment.
Figure 10:
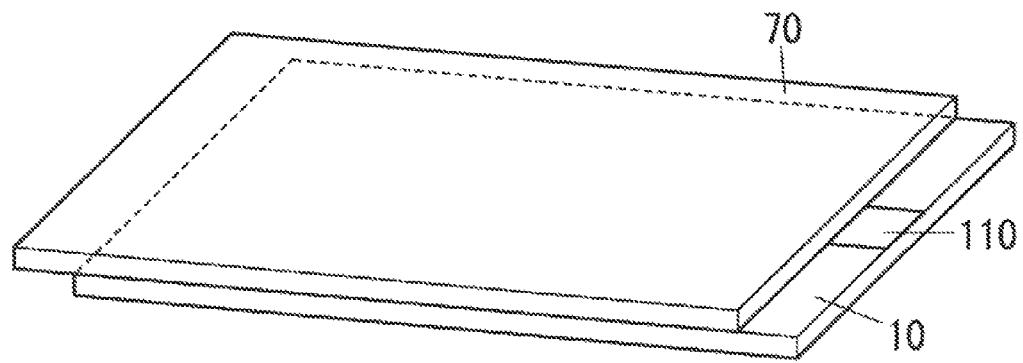
FIG. 10 is a schematic perspective view illustrating the third modification of the organic electroluminescence element of the first embodiment.

FIG. 9 and FIG. 10 show the third modification of the organic electroluminescence element of the present embodiment. In the third modification, the first substrate 10 has a planar size not greater than a planar size of the second substrate 70, and the first substrate 10 and the second substrate 70 have the same planar size. Further, center lines of the first substrate 10 and the second substrate 70 extending along a common thickness direction are on different positions in a common plane to allow the first extension electrode 11 to have a part (right end in FIG. 9) that does not overlap the second substrate 70 in a plan view, and this part (right end in FIG. 9) is used as the first terminal 110.

Additionally, in the third modification, the second substrate 70 has a planar size not greater than a planar size of the first substrate 10, and the first substrate 10 and the second substrate 70 have the same planar size. Further, center lines of the first substrate 10 and the second substrate 70 extending along a common thickness direction are on different positions in a common plane to allow the second extension electrode 71 to have a part (left end in FIG. 9) that does not overlap the first substrate 10 in a plan view, and this part (left end in FIG. 9) is used as the second terminal 130.

Figure 11:
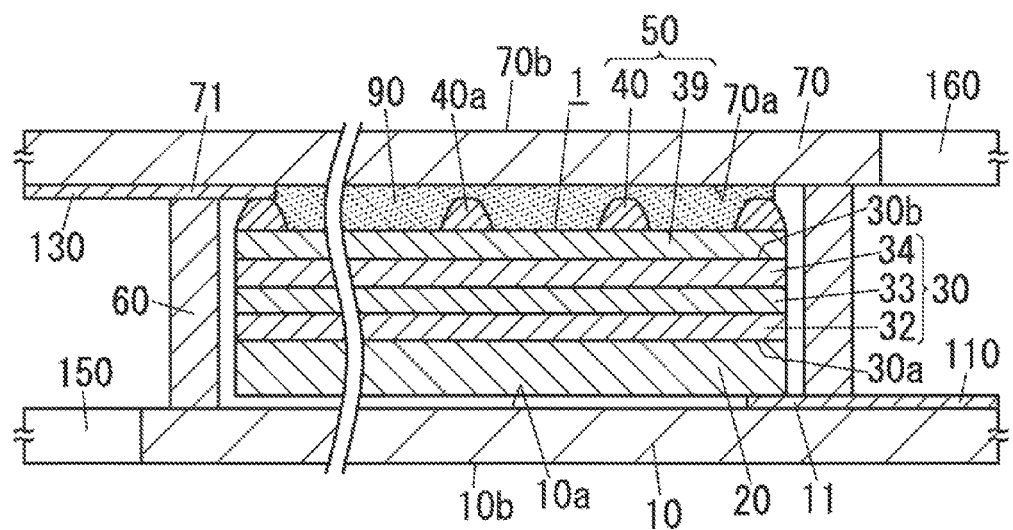
FIG. 11 is a schematic sectional view illustrating the fourth modification of the organic electroluminescence element of the first embodiment.
Figure 12:
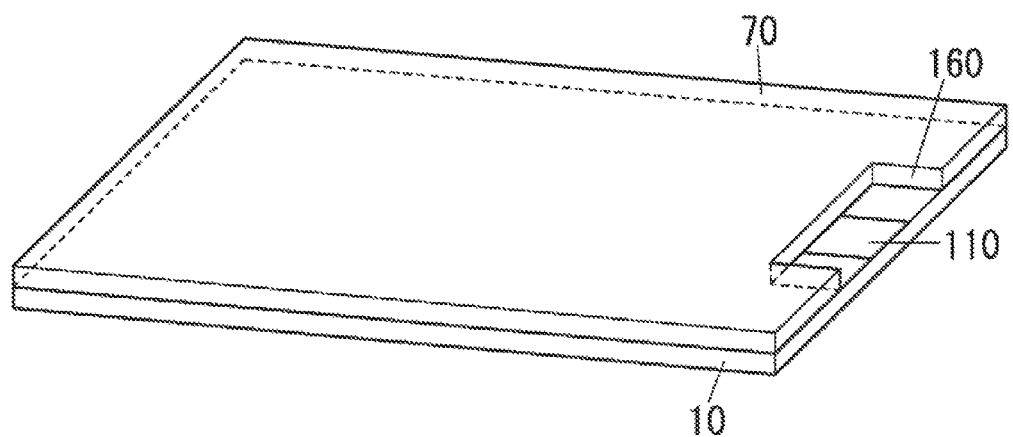
FIG. 12 is a schematic perspective view illustrating the fourth modification of the organic electroluminescence element of the first embodiment.

FIG. 11 and FIG. 12 show the fourth modification of the organic electroluminescence element of the present embodiment. In the fourth modification, the first substrate 10 and the second substrate 70 have the same planar size. Further, the second substrate 70 is provided at a periphery with an aperture (second aperture) 160 to allow the first extension electrode 11 to have a part (right end in FIG. 11) that does not overlap the second substrate 70 in a plan view, and this part (right end in FIG. 11) is used as the first terminal 110.

In brief, in the fourth modification, the second substrate 70 includes the aperture (second aperture) 160 exposing the first extension electrode 11. The fourth modification can facilitate connecting an external wire to the first extension electrode 11 (the first terminal 110 connected to the first extension electrode 11).

Additionally, in the fourth modification, the first substrate 10 and the second substrate 70 have the same planar size. Further, the first substrate 10 is provided at a periphery with an aperture (first aperture) 150 to allow the second extension electrode 71 to have a part (left end in FIG. 11) that does not overlap the first substrate 10 in a plan view, and this part (left end in FIG. 11) is used as the second terminal 130.

In brief, in the fourth modification, the first substrate 10 includes the aperture (first aperture) 150 exposing the second extension electrode 71. The fourth modification can facilitate connecting an external wire to the second extension electrode 71 (the second terminal 130 connected to the second extension electrode 71).

Further, in the third modification and the fourth modification, the first extension electrode 11 and the second extension electrode 71 are arranged not to face each other.

Consequently, the third modification and the fourth modification can have a distance between the first extension electrode 11 and the second extension electrode 71 longer than that in a structure where the first extension electrode 11 and the second extension electrode 71 face each other. Hence, it is possible to improve a property of insulating the first electrode layer 20 and the second electrode layer 50 from each other.

Figure 13:
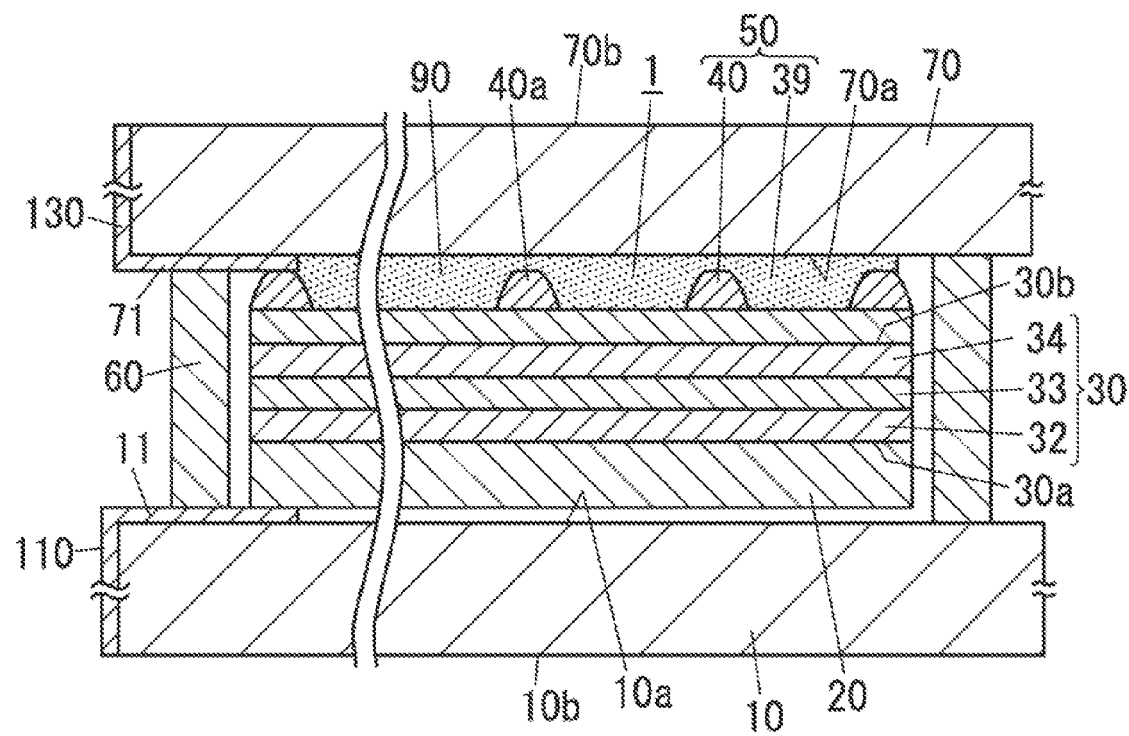
FIG. 13 is a schematic sectional view illustrating the fifth modification of the organic electroluminescence element of the first embodiment.

FIG. 13 shows the fifth modification of the organic electroluminescence element of the present embodiment. In the fifth modification, the first extension electrode 11 extends to the side surface (left side surface in FIG. 11) of the first substrate 10. The first extension electrode 11 has a part formed on the side surface (left side surface in FIG. 13) of the first substrate 10, and the part is used as the first terminal 110.

In brief, the fifth modification further includes the first terminal 110 formed on the side surface (left side surface in FIG. 13) of the first substrate 10. The first extension electrode 11 is electrically connected to the first terminal 110. The fifth modification can successfully prevent a short circuit between the first terminal 110 and the second extension electrode 71 (the second terminal 130 connected to the second extension electrode 71).

Additionally, in the fifth modification, the second extension electrode 71 extends to the side surface (left side surface in FIG. 13) of the second substrate 70. The second extension electrode 71 has a part formed on the side surface (left side surface in FIG. 13) of the second substrate 70, and the part is used as the second terminal 130.

In brief, the fifth modification further includes the second terminal 130 formed on the side surface (left side surface in FIG. 13) of the second substrate 70. The second extension electrode 71 is electrically connected to the second terminal 130. The fifth modification can successfully prevent a short circuit between the second terminal 130 and the first extension electrode 11 (the first terminal 110 connected to the first extension electrode 11).

Note that, in the basic example illustrated in FIG. 1, the first modification illustrated in FIG. 6, the second modification illustrated in FIG. 7 and FIG. 8, and the fifth modification illustrated in FIG. 13, the first extension electrode 11 and the second extension electrode 71 may be arranged not to face each other.

In the organic electroluminescence element of the present embodiment, the insulating member 60 is formed into a frame shape (rectangular frame shape in the present embodiment) to be interposed between the entire periphery of the surface (upper surface in FIG. 1) of the first substrate 10 and the entire periphery of the surface (lower surface in FIG. 1) of the second substrate 70.

In other words, the insulating member 60 includes a first part interposed between the first substrate 10 and the second substrate 70 and a second part interposed between the first extension electrode 11 and the second extension electrode 71.

In this regard, the insulating member 60 is bonded to each of the first substrate 10, the first extension electrode 11, the second substrate 70, and the second extension electrode 71 in an air-tight manner. Hence, in the organic electroluminescence element, a space enclosed by the first substrate 10, the second substrate 70, and the insulating member 60 is an air-tight space.

Additionally, the example (basic example of the organic electroluminescence element of the present embodiment) shown in FIG. 1 has a gap between the insulating member 60 and a side surface of the element member 1. Alternatively, the insulating member 60 may be in contact with the side surface of the element member 1. Alternatively, an enclosing member (not shown) may be provided between the insulating member 60 and the element member 1.

Preferably, material of the insulating member 60 has an electrically insulating property and a gas barrier property. For example, the insulating member 60 may be made of an epoxy resin and alternatively may be made of an acrylic resin. An epoxy resin and an acrylic resin used as material of the insulating member 60 may be ultraviolet curable or thermoset. Alternatively, the insulating member 60 may be made of an epoxy resin containing fillers of an inorganic insulator (e.g., silica and alumina). Alternatively, the insulating member 60 may be made of an ultraviolet curable resin (e.g., an epoxy resin, an acrylic resin, and a silicone resin) containing a hygroscopic agent.

It is preferable that the hygroscopic agent be selected from alkaline-earth metal oxide and sulfate. The alkaline-earth metal oxide may include calcium oxide, barium oxide, magnesium oxide, and strontium oxide, for example. The sulfate may include lithium sulfate, sodium sulfate, gallium sulfate, titanium sulfate, nickel sulfate, for example. Further, the hygroscopic agent may be selected from calcium chloride, magnesium chloride, copper chloride, and magnesium oxide. Additionally the hygroscopic agent may be a hygroscopic organic compound such as silica gel and polyvinyl alcohol. The hygroscopic agent is not limited to materials listed above. However, in these materials, calcium oxide, barium oxide, and silica gel are preferable. Note that, content by percentage of the hygroscopic agent in the insulating member 60 is not limited particularly.

As mentioned above, the organic electroluminescence element of the present embodiment described above includes: the first substrate 10; the first electrode 20 on the surface (upper surface in FIG. 1) of the first substrate 10; the second electrode 50 which is over the surface of the first substrate 10 and faces the first electrode 20; and the functional layer 30 which is between the first electrode 20 and the second electrode 50 and includes the light-emitting layer 32. Further, the organic electroluminescence element includes the second substrate 70 which is positioned over the surface of the first substrate 10 in such a way to be away from the second electrode 50 and face the first substrate 10. Additionally, the organic electroluminescence element includes: the first extension electrode 11 electrically connected to the first electrode 20; and the second extension electrode 71 electrically connected to the second electrode 50. In this regard, the first extension electrode 11 is formed on the surface (first inner surface) 10a of the first substrate 10 to extend between the inside and the outside of the projection region of the first electrode 20 to have the part which is interposed between the surface (first inner surface) 10a of the first substrate 10 and the periphery of the first electrode 20. Further, the second extension electrode 71 is formed on the facing surface (second inner surface) 70a of the second substrate 70 which is defined as the surface facing the first substrate 10 to extend between the inside and the outside of the projection region of the second electrode 50 to have the part which is interposed between the facing surface (inner surface) 70a of the second substrate 70 and the periphery of the second electrode 50. Furthermore, the organic electroluminescence element includes the insulating member 60 interposed between the first extension electrode 11 and the second extension electrode 71.

In other words, the organic electroluminescence element of the present embodiment includes: the first substrate 10; the second substrate 70 positioned to face the first substrate 10; the element member 1 interposed between the first substrate 10 and the second substrate 70; the first extension electrode 11 formed on the first inner surface 10a of the first substrate 10 facing the element member 1; the second extension electrode 71 formed on the second inner surface 70a of the second substrate 70 facing the element member 1; and the insulating member 60 having an electrically insulating property. The element member 1 includes: the functional layer 30 including the light-emitting layer 32 and having the first surface 30a and the second surface 30b in the thickness direction thereof; the first electrode layer 20 positioned on the first surface 30a of the functional layer 30; and the second electrode layer 50 positioned on the second surface 30b of the functional layer 30. The element member 1 is interposed between the first extension electrode 11 and the second extension electrode 71 such that the part of the first electrode layer 20 is in contact with the first extension electrode 11 and the part of the second electrode layer 50 is in contact with the second extension electrode 71. The insulating member 60 is interposed between the first inner surface 10a of the first substrate 10 and the second inner surface 70a of the second substrate 70.

Accordingly, in the organic electroluminescence element of the present embodiment, the first extension electrode 11 and the second extension electrode 71 are spaced away from each other by a distance equal to a thickness of the element member 1, and are electrically insulated from each other by the insulating member 60 and also the first electrode (first electrode layer) 20 and the second electrode (second electrode layer) 50 are electrically insulated from each other. Hence, the organic electroluminescence element can have an improved property of insulating the first electrode (first electrode layer) 20 and the second electrode (second electrode layer) 50 from each other.

Further, in the organic electroluminescence element of the present embodiment, the shortest distance d1 between the first extension electrode 11 and the second electrode layer 50 is longer than the shortest distance d2 between the first electrode layer 20 and the second electrode layer 50. The shortest distance d3 between the second extension electrode 71 and the first electrode layer 20 is longer than the shortest distance d2 between the second electrode layer 50 and the first electrode layer 20.

Hence, in the organic electroluminescence element of the present embodiment, a distance between the first extension electrode 11 and the second extension electrode 71 is longer than a distance between the first substrate 10 and the second electrode 50. Therefore, the property of insulating the first electrode (first electrode layer) 20 and the second electrode (second electrode layer) 50 from each other is improved relative to a structure where the first electrode layer 10 and the second electrode layer 50 are also used as the first extension electrode 11 and the second extension electrode 71 respectively. Note that, this configuration is optional.

Furthermore, in the organic electroluminescence element of the present embodiment, the second electrode layer 50 is designed to allow passage of light emitted from the light-emitting layer 32. The second substrate 70 is designed to allow passage of light emitted from the light-emitting layer 32. Hence, the organic electroluminescence element of the present embodiment allows extraction of light via the second electrode layer 50 and the second substrate 70. In brief, the organic electroluminescence element of the present embodiment can be used as a top emission type organic electroluminescence element. Note that, this configuration is optional.

Moreover, in the organic electroluminescence element of the present embodiment, the first electrode layer 20 is designed to reflect light emitted from the light-emitting layer 32. Hence, the organic electroluminescence element of the present embodiment can have an improved light extraction efficiency. Note that, this configuration is optional.

Additionally, in the organic electroluminescence element of the present embodiment, the insulating member 60, the first substrate 10, and the second substrate 70 are designed to constitute a housing designed to enclose the element member 1 in an air-tight manner. Hence, the organic electroluminescence element of the present embodiment can protect the element member 1. Note that, this configuration is optional.

The following explanation referring to FIG. 1, FIG. 14, FIG. 15, and FIG. 16 is made to a production method of the organic electroluminescence element of the present embodiment.

Figure 14:
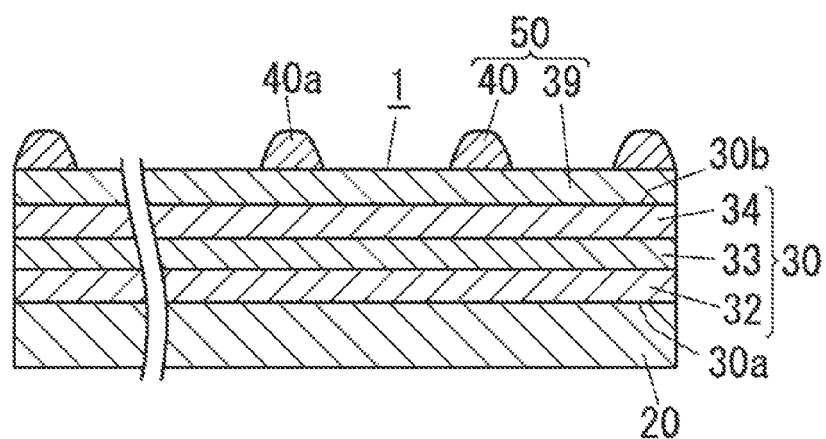
FIG. 14 is a diagram illustrating the production method for the organic electroluminescence element of the first embodiment.

First, as shown in FIG. 14, the element member 1 is prepared (the first step). For example, in a process of forming the element member 1, the first electrode layer 20 formed of metal foil is prepared. Subsequently, the functional layer 30 is formed on the surface (upper surface in FIG. 14) of the first electrode layer 20 with a coating method. Thereafter, the electrically conductive layer 39 is formed on the second surface 30b of the functional layer 30. After that, the patterned electrode 40 is formed on the electrically conductive layer 39 with screen printing or gravure printing. Consequently, the element member 1 illustrated in FIG. 14 is formed. Note that, in the process of forming the element member 1, a work including the first electrode layer 20, the functional layer 30, and the second electrode layer 50 may be formed and the work may be divided into a plurality of element members 1.

Next, the first substrate 10 on which the first extension electrode 11 is formed and the second substrate 70 on which the second extension electrode 71 is formed are prepared (the second step).

Subsequently, the element member 1, the first substrate 10, and the second substrate 70 are arranged in such a manner that the element member 1 is interposed between the first extension electrode 11 and the second extension electrode 71 such that the part of the first electrode layer 10 is in contact with the first extension electrode 11 and the part of the second electrode layer 50 is in contact with the second extension electrode 71 (the third step).

In the third step, first, the element member 1 is fixed to the first substrate 10 as shown in FIG. 15. For example, the element member 1 is fixed to the first substrate 10 by bonding an edge (left edge in FIG. 15) of a bottom surface (lower surface in FIG. 15) of the first electrode layer 20 to the first extension electrode 11 on the first substrate 10 with electrically conductive adhesive.

Subsequently, as shown in FIG. 16, the insulating member 60 is formed on the first inner surface 10a of the first substrate 10 to surround the element member 1. The insulating member 60 is formed with screen printing, for example. The insulating member 60 is made of adhesive with an electrically insulating property, for example.

Thereafter, the second substrate 70 is placed above the first inner surface 10a of the first substrate 10 in such a manner that the second inner surface 70a faces the first inner surface 10a (see FIG. 1). Subsequently, the element member 1 is fixed to the second substrate 70. For example, the element member 1 is fixed to the second substrate 70 by bonding an edge (left edge in FIG. 1) of the electrode part 40a of the second electrode layer 50 to the second extension electrode 71 on the second substrate 70 with electrically conductive adhesive. Note that, during a process of fixing the element member 1 to the second substrate 70, the resin layer 90 is interposed between the second substrate 70 and the second electrode layer 50 of the element member 1.

Thus, the element member 1 is positioned between the first extension electrode 11 and the second extension electrode 71. With regard to the element member 1, the first electrode layer 10 has the part (left end in FIG. 1) being in contact with the first extension electrode 11. Additionally, the second electrode layer 50 has the part (left end in FIG. 1) being in contact with the second extension electrode 71.

Subsequently, the first substrate 10 is bonded to the second substrate 70 with the insulating member 60 (the fourth step). For example, pressure bonding is performed by exerting predetermined pressure on each of the first outer surface 10b of the first substrate 10 and the second outer surface 70b of the second substrate 70. Consequently, the organic electroluminescence element illustrated in FIG. 1 is obtained.

As described above, the production method for the organic electroluminescence element of the present embodiment includes the first step, the second step, the third step, and the fourth step. The first step is a step of preparing the element member 1. The element member 1 includes: the functional layer 30 including the light-emitting layer 32 and having the first surface 30a and the second surface 30b in the thickness direction; the first electrode layer 20 positioned on the first surface 30a of the functional layer 30; and the second electrode layer 50 positioned on the second surface 30b of the functional layer 30. The second step is a step of preparing the first substrate on which the first extension electrode 11 is formed and the second substrate 70 on which the second extension electrode 71 is formed. The third step is a step of arranging the element member 1, the first substrate 10, and the second substrate 70 in such a manner that the element member 1 is interposed between the first extension electrode 11 and the second extension electrode 71 such that the part of the first electrode layer 20 is in contact with the first extension electrode 11 and the part of the second electrode layer 50 is in contact with the second extension electrode 71. The fourth step is a step of bonding the first substrate 10 to the second substrate 70 with the insulating member 60 having an electrically insulating property.

According the production method for the organic electroluminescence element of the present embodiment, it is possible to easily produce the organic electroluminescence element with the improved property of insulating the first electrode layer (first electrode) 20 and the second electrode layer (second electrode) 50 from each other. Further, for example, also in a case where the functional layer is formed on a sheet continuously and they are divided into the element members, it is possible to enclose the element member in a simplified manner and to form electrode connection parts.

Note that, with regard to the production method for the organic electroluminescence element of the present embodiment described above, in a process of arranging the element member 1, the first substrate 10, and the second substrate 70 (the third step), the part of the first electrode layer 10 and the part of the second electrode layer 50 need not necessarily be in contact with the first extension electrode 11 and the second extension electrode 71 respectively. For example, the part of the first electrode layer 10 and the part of the second electrode layer 50 may be in contact with the first extension electrode 11 and the second extension electrode 71 respectively in a process of bonging the first substrate 10 to the second substrate 70 with the insulating member 60 (the fourth step).

Besides, the term "contact" in this description is used for expressing not only a situation where the part of the first electrode layer 10 is in direct contact with the first extension electrode 11 but also a situation where the part of the first electrode layer 10 is close to the first extension electrode 11 and electrically conductive adhesive or the like is interposed therebetween.

In a case where the second electrode 50 is constituted by a transparent electrode made of a transparent conducting oxide, the second electrode 50 has a sheet resistance greater than a sheet resistance of the first electrode 20 of a metal film or the like. Hence, the second electrode 50 tends to have a larger potential gradient and therefore in-plane unevenness in luminance is likely to increase.

However, in the organic electroluminescence element of the present embodiment, the second electrode 50 includes the conductive polymer layer 39 and the patterned electrode 40. The conductive polymer layer 39 is in contact with the functional layer 30. The patterned electrode 40 is on an opposite side of the conductive polymer layer 39 from the functional layer 30, and includes the opening part 41 for allowing passage of light from the functional layer 30.

In other words, in the organic electroluminescence element of the present embodiment, the second electrode 50 includes: the patterned electrode 40; and the electrically conductive layer 39 made of material allowing passage of light emitted from the light-emitting layer 32. The patterned electrode 40 includes: the electrode part 40a covering the second surface 30b of the functional layer 30; and the opening part 41 formed in the electrode part 40a to expose the second surface 30b of the functional layer 30. The electrically conductive layer 39 is interposed between the second surface 30b of the functional layer 30 and the patterned electrode 40 so as to cover the second surface 30b of the functional layer 30.

Therefore, according to the organic electroluminescence element of the present embodiment, in contrast to a case where the second electrode 50 is constituted by a transparent electrode made of a transparent conducting oxide, the luminance unevenness can be reduced. Note that, this configuration is optional.

Note that, the electrically conductive layer 39 may be formed on the patterned electrode 40 to cover the second electrode 30b of the functional layer 30. Alternatively, the electrically conductive layer 39 may be positioned inside the opening part 41 so as to cover a region of the second surface 30b of the functional layer 30 exposed through the opening part 41 and be in contact with the electrode part 40a.

Further, the organic electroluminescence element of the present embodiment includes the second substrate 70 and the resin layer 90. The second substrate 70 is light transmissive and is positioned over the surface (upper surface in FIG. 1) of the first substrate 10 so as to face the surface of the first substrate 10. The resin layer 90 is light transmissive and has a refractive index not less than a refractive index of the conductive polymer layer 39. The resin layer 90 is interposed between the second electrode 50 and the second substrate 70.

In other words, the organic electroluminescence element of the present embodiment includes the resin layer 90 allowing passage of light emitted from the light-emitting layer 32. The resin layer 90 is interposed between the second electrode layer 50 and the second substrate 70. The resin layer 90 has a refractive index equal to a refractive index of the electrically conductive layer 39 or more.

Consequently, the organic electroluminescence element of the present embodiment can have the improved light extraction efficiency. Note that, this configuration is optional.

In this organic electroluminescence element, it is preferable that the second electrode 50 serves as an anode and that the functional layer 30 includes the hole injection layer 34 on the side of the light-emitting layer 32 close to the second electrode 50. Thus, in the organic electroluminescence element, it is possible to more efficiently inject holes of the second carriers into the light-emitting layer 32 and consequently improve the external quantum efficiency.

It is preferred that the organic electroluminescence element includes a light extraction structure (not shown) on the outer surface of the second substrate 70 (the opposite side of the second substrate 70 from the first substrate 10) for suppressing reflection of light emitted from the light-emitting layer 32 at the outer surface.

For example, the above light extraction structure may be an uneven structure having a two-dimensional periodic structure. In a case where the wavelength of the light emitted from the light-emitting layer falls within a range of 300 nm to 800 nm, the periodic length of such a two-dimensional periodic structure is preferably within a range of quarter to tenfold of a wavelength $\lambda$. The wavelength $\lambda$ denotes the wavelength of the light in the medium (i.e. $\lambda$ is obtained by dividing the wavelength in vacuum by the refractive index of the medium).

Such an uneven structure can be preliminarily formed on the outer surface with an imprint method such as a thermal imprint method (a thermal nanoimprint method) and a photo imprint method (a photo nanoimprint method). Depending on material of the second substrate 70, the second substrate 70 can be formed with injection molding. In this case, the uneven structure can be formed directly on the second substrate 70 by using a proper mold in a process of injection molding. Also, the uneven structure can be formed of a member separate from the second substrate 70. For example, the uneven structure can be constituted by a prismatic sheet (e.g. a light diffusion film such as LIGHT-UP GM3 ("LIGHT UP" is a registered trademark) available from KIMOTO CO., LTD.).

The organic electroluminescence element of the present embodiment includes the light extraction structure and therefore it is possible to reduce the reflection loss of the light which is emitted from the light-emitting layer 32 and then strikes the outer surface of the second substrate 70. As a result, this configuration can improve the light extraction efficiency.

Additionally, in the organic electroluminescence element, the insulating member 60 may contain a hygroscopic agent as described above. Consequently, the reliability of the organic electroluminescence element can be improved.

(Second Embodiment)

The organic electroluminescence element of the present embodiment shown in FIG. 17 has substantially the same structure as the first embodiment, but is different from the first embodiment in that a hygroscopic member 80 is interposed between the surface of the first substrate 10 and the first electrode 20. Note that, since other components are the same as those of the first embodiment, the components are designated by the same reference numerals and no explanations thereof are deemed necessary.

The hygroscopic member 80 may be made of photocurable or thermosetting resin (e.g., epoxy resin, acrylic resin, and silicone resin) containing a hygroscopic agent.

This hygroscopic agent may be selected from the examples of the hygroscopic agent listed in the first embodiment. Note that, content by percentage of the hygroscopic agent in the hygroscopic member 80 is not limited particularly. For example, the hygroscopic member 80 may be formed of only the hygroscopic agent.

It is preferable that the hygroscopic member 80 be present on the whole of a region, which does not overlap the first extension electrode 11, of the surface of the first electrode 20 close to the first substrate 10.

In the organic electroluminescence element of the present embodiment, the hygroscopic member 80 is interposed between the surface (the first inner surface) 10a of the first substrate 10 and the first electrode 20.

In other words, the organic electroluminescence element of the present embodiment further includes the hygroscopic member 80 absorbing moisture. The hygroscopic member 80 is interposed between the first electrode layer 20 and the first substrate 10.

Hence, according to the organic electroluminescence element of the present embodiment, volume of the hygroscopic member 80 can be increased. Thus, it is possible to more suppress deterioration in the element member 1 (e.g., occurrence of a dark spot) due to moisture. Therefore, the reliability of the organic electroluminescence element of the present embodiment can be more improved. Note that, this configuration is optional.

Further, in the organic electroluminescence element of the present embodiment, the hygroscopic member 80 is provided between the surface (first inner surface) 10a of the first substrate 10 and the first electrode 20. Hence, it is possible to suppress the hygroscopic member 80 from absorbing and reflecting light emitted from the light-emitting layer 32. Consequently, it is possible to increase the volume of the hygroscopic member 80 and nevertheless it is possible to suppress loss of light due to the presence of the hygroscopic member 80.

Note that, the hygroscopic member 80 may be provided to the first to fifth modifications described in the first embodiment.

Further, also in the organic electroluminescence element of the present embodiment, the first extension electrode 11 and the second extension electrode 71 are allowed to be arranged not to face each other.

The production method for the organic electroluminescence element of the present embodiment is similar to the production method (the first to fourth steps) described in the first embodiment (see FIG. 14 to FIG. 17). However, the production method for the organic electroluminescence element of the present embodiment is different from the production method of the first embodiment in that, in a process of fixing the element member 1 to the first substrate 10 in the third step, the hygroscopic member 80 is interposed between the first substrate 10 and the first electrode 20 of the element member 1.

The organic electroluminescence elements described in the respective embodiments are preferably available, for example, for organic electroluminescence elements for lighting use. However, the organic electroluminescence elements are available for not only lighting use but also other use.

Note that, the figures used for describing the respective embodiments are schematic ones, and do not necessarily show the actual ratio of the length, thickness, or the like of the components.

The invention claimed is:

1. An organic electroluminescence element comprising:
a first substrate;
a second substrate positioned to face the first substrate;
an element member between the first substrate and the second substrate;
a first extension electrode formed on a first inner surface of the first substrate facing the element member;
a second extension electrode formed on a second inner surface of the second substrate facing the element member; and
an insulating member having an electrically insulating property,
wherein:
the element member includes
a functional layer including a light-emitting layer and having a first surface and a second surface in a thickness direction,
a first electrode layer positioned on the first surface of the functional layer, and
a second electrode layer positioned on the second surface of the functional layer;
the element member is between the first extension electrode and the second extension electrode such that a part of the first electrode layer is in contact with the first extension electrode and a part of the second electrode layer is in contact with the second extension electrode;
the insulating member is between the first inner surface of the first substrate and the second inner surface of the second substrate;
the second electrode layer is designed to allow passage of light emitted from the light-emitting layer;
the second substrate is designed to allow passage of light emitted from the light-emitting layer;
the second electrode layer includes
a patterned electrode, and
an electrically conductive layer made of material allowing passage of light emitted from the light-emitting layer;
the patterned electrode includes
an electrode part covering the second surface of the functional layer, and
an opening part formed in the electrode part to expose the second surface of the functional layer;
the electrically conductive layer is between the second surface of the functional layer and the patterned electrode so as to cover the second surface of the functional layer; and
the electrode part of the patterned electrode of the second electrode layer is in direct contact with the second extension electrode.

2. The organic electroluminescence element as set forth in claim 1, wherein:
a shortest distance between the first extension electrode and the second electrode layer is longer than a shortest distance between the first electrode layer and the second electrode layer; and
a shortest distance between the second extension electrode and the first electrode layer is longer than a shortest distance between the second electrode layer and the first electrode layer.

3. The organic electroluminescence element as set forth in claim 1, further comprising a hygroscopic member absorbing moisture,
wherein the hygroscopic member is between the first electrode layer and the first substrate.

4. The organic electroluminescence element as set forth in claim 1, further comprising a resin layer allowing passage of light emitted from the light-emitting layer,
wherein:
the resin layer is between the second electrode layer and the second substrate; and
the resin layer has a refractive index equal to a refractive index of the electrically conductive layer or more.

5. The organic electroluminescence element as set forth in claim 1, wherein
the first electrode layer is designed to reflect light emitted from the light-emitting layer.

6. The organic electroluminescence element as set forth in claim 1, wherein
the first extension electrode and the second extension electrode are arranged not to face each other.

7. The organic electroluminescence element as set forth in claim 1, wherein
the insulating member, the first substrate, and the second substrate are designed to constitute a housing designed to enclose the element member in an air-tight manner.

8. The organic electroluminescence element as set forth in claim 1, further comprising a first terminal,
wherein:
the first substrate has a first outer surface which is an opposite surface of the first substrate from the first inner surface;
the first terminal is formed on the first outer surface of the first substrate; and
formed in the first substrate is a first through wire electrically connecting the first extension electrode to the first terminal.

9. The organic electroluminescence element as set forth in claim 1, wherein
the second substrate includes an aperture exposing the first extension electrode.

10. The organic electroluminescence element as set forth in claim 1, further comprising a first terminal formed on a side surface of the first substrate,
wherein the first extension electrode is electrically connected to the first terminal.

11. The organic electroluminescence element as set forth in claim 1, further comprising a second terminal,
wherein:
the second substrate has a second outer surface which is an opposite surface of the second substrate from the second inner surface;
the second terminal is formed on the second outer surface of the second substrate; and
formed in the second substrate is a second through wire electrically connecting the second extension electrode to the second terminal.

12. The organic electroluminescence element as set forth in claim 1, wherein the first substrate includes an aperture exposing the second extension electrode.

13. The organic electroluminescence element as set forth in claim 1, further comprising a second terminal formed on a side surface of the second substrate,
wherein the second extension electrode is electrically connected to the second terminal.

14. The organic electroluminescence element as set forth in claim 1, wherein:
the first extension electrode is separated from the second substrate; and
the second extension electrode is separated from the first substrate.

15. The organic electroluminescence element as set forth in claim 1, wherein a thickness of the insulating member is greater than a width of the insulating member.

16. The organic electroluminescence element as set forth in claim 1, wherein at least a portion of the insulating member is in direct contact with at least one of the first and second substrates.

17. A production method for an organic electroluminescence element comprising steps of:
preparing an element member which includes: a functional layer including a light-emitting layer and having a first surface and a second surface in a thickness direction; a first electrode layer positioned on the first surface of the functional layer; and a second electrode layer positioned on the second surface of the functional layer;
preparing a first substrate on which a first extension electrode is formed and a second substrate on which a second extension electrode is formed;
subsequent to preparing the element member and preparing the first and second substrates, arranging the element member, the first substrate, and the second substrate in such a manner that the element member is between the first extension electrode and the second extension electrode such that a part of the first electrode layer is in contact with the first extension electrode and a part of the second electrode layer is in contact with the second extension electrode; and
bonding the first substrate to the second substrate with an insulating member having an electrically insulating property
wherein:
the second electrode layer is designed to allow passage of light emitted from the light-emitting layer;
the second substrate is designed to allow passage of light emitted from the light-emitting layer;
the second electrode layer includes
a patterned electrode, and
an electrically conductive layer made of material allowing passage of light emitted from the light-emitting layer;
the patterned electrode includes
an electrode part covering the second surface of the functional layer, and
an opening part formed in the electrode part to expose the second surface of the functional layer;
the electrically conductive layer is between the second surface of the functional layer and the patterned electrode so as to cover the second surface of the functional layer; and
the electrode part of the patterned electrode of the second electrode layer is in direct contact with the second extension electrode.

18. The production method for the organic electroluminescence element as set forth in claim 17, wherein:
the first extension electrode is separated from the second substrate; and
the second extension electrode is separated from the first substrate.

* * * * *